(12) United States Patent
Shimomura et al.

(10) Patent No.: US 8,994,131 B2
(45) Date of Patent: Mar. 31, 2015

(54) MAGNETIC MEMORY

(71) Applicant: Kabushiki Kaisha Toshiba, Tokyo (JP)

(72) Inventors: Naoharu Shimomura, Tokyo (JP); Eiji Kitagawa, Yokohama (JP); Chikayoshi Kamata, Kawasaki (JP); Minoru Amano, Sagamihara (JP); Yuichi Ohsawa, Yokohama (JP); Daisuke Saida, Tokyo (JP); Megumi Yakabe, Kawasaki (JP); Hiroaki Maekawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/833,995

(22) Filed: Mar. 15, 2013

(65) Prior Publication Data
US 2014/0084402 A1 Mar. 27, 2014

(30) Foreign Application Priority Data
Sep. 25, 2012 (JP) ................. 2012-210980

(51) Int. Cl.
| H01L 43/02 | (2006.01) |
| H01L 43/08 | (2006.01) |
| G11C 11/16 | (2006.01) |
| H01L 27/22 | (2006.01) |
| H01L 43/12 | (2006.01) |

(52) U.S. Cl.
CPC .............. *H01L 43/02* (2013.01); *G11C 11/161* (2013.01); *H01L 43/08* (2013.01); *H01L 27/228* (2013.01); *H01L 43/12* (2013.01)
USPC .................... 257/421; 257/422; 257/E43.004

(58) Field of Classification Search
CPC .................. H01L 43/08; G11C 11/02; G11C 11/14–11/16; G11C 11/161

USPC ........... 257/421, 422, E43.004; 365/158, 171
See application file for complete search history.

(56) References Cited

U.S. PATENT DOCUMENTS

| 7,738,287 B2* | 6/2010 | Diao et al. ................. 365/158 |
| 7,893,511 B2* | 2/2011 | Ruehrig et al. ............. 257/427 |
| 8,223,533 B2 | 7/2012 | Ozeki et al. |
| 2008/0247098 A1* | 10/2008 | Deak .......................... 360/328 |
| 2010/0109110 A1* | 5/2010 | Wang et al. ................. 257/421 |
| 2013/0037862 A1* | 2/2013 | Kitagawa et al. ........... 257/252 |

FOREIGN PATENT DOCUMENTS

| JP | 2010-080649 | 4/2010 |
| JP | 2010-80649 | 4/2010 |
| JP | 2010-225783 | 10/2010 |
| WO | WO 2011/036753 | 3/2011 |

OTHER PUBLICATIONS

Office Action issued Jan. 27, 2015, in Japanese Patent Application No. 2014-095765, (with English-language Translation) 6 pages.

* cited by examiner

*Primary Examiner* — Allison P Bernstein
(74) *Attorney, Agent, or Firm* — Oblon, Spivak, McClelland, Maier & Neustadt, L.L.P.

(57) ABSTRACT

According to one embodiment, a magnetic memory includes a first magnetoresistive element includes a storage layer with a perpendicular and variable magnetization, a tunnel barrier layer, and a reference layer with a perpendicular and invariable magnetization, and stacked in order thereof in a first direction, and a first shift corrective layer with a perpendicular and invariable magnetization, the first shift corrective layer and the storage layer arranged in a direction intersecting with the first direction. Magnetization directions of the reference layer and the first shift corrective layer are the same.

19 Claims, 31 Drawing Sheets

-- Prior Art --
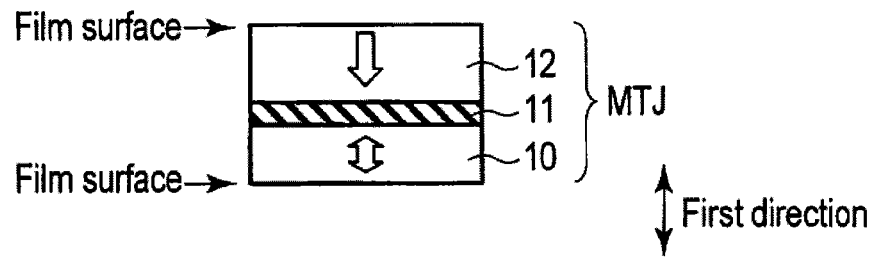
F I G. 1
-- Prior Art --
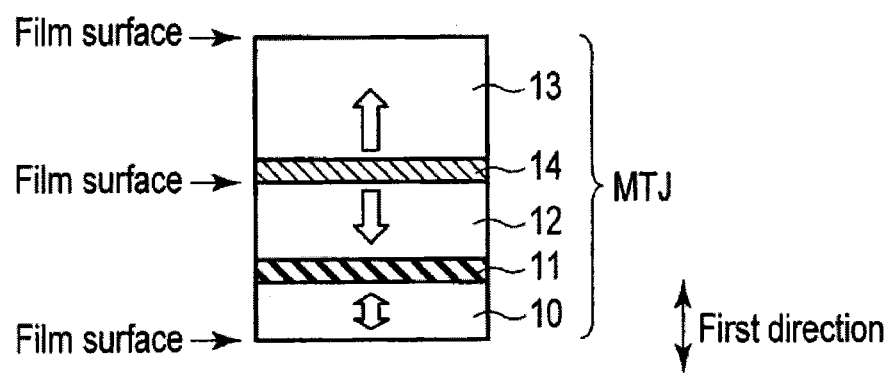
F I G. 2

-- Prior Art --

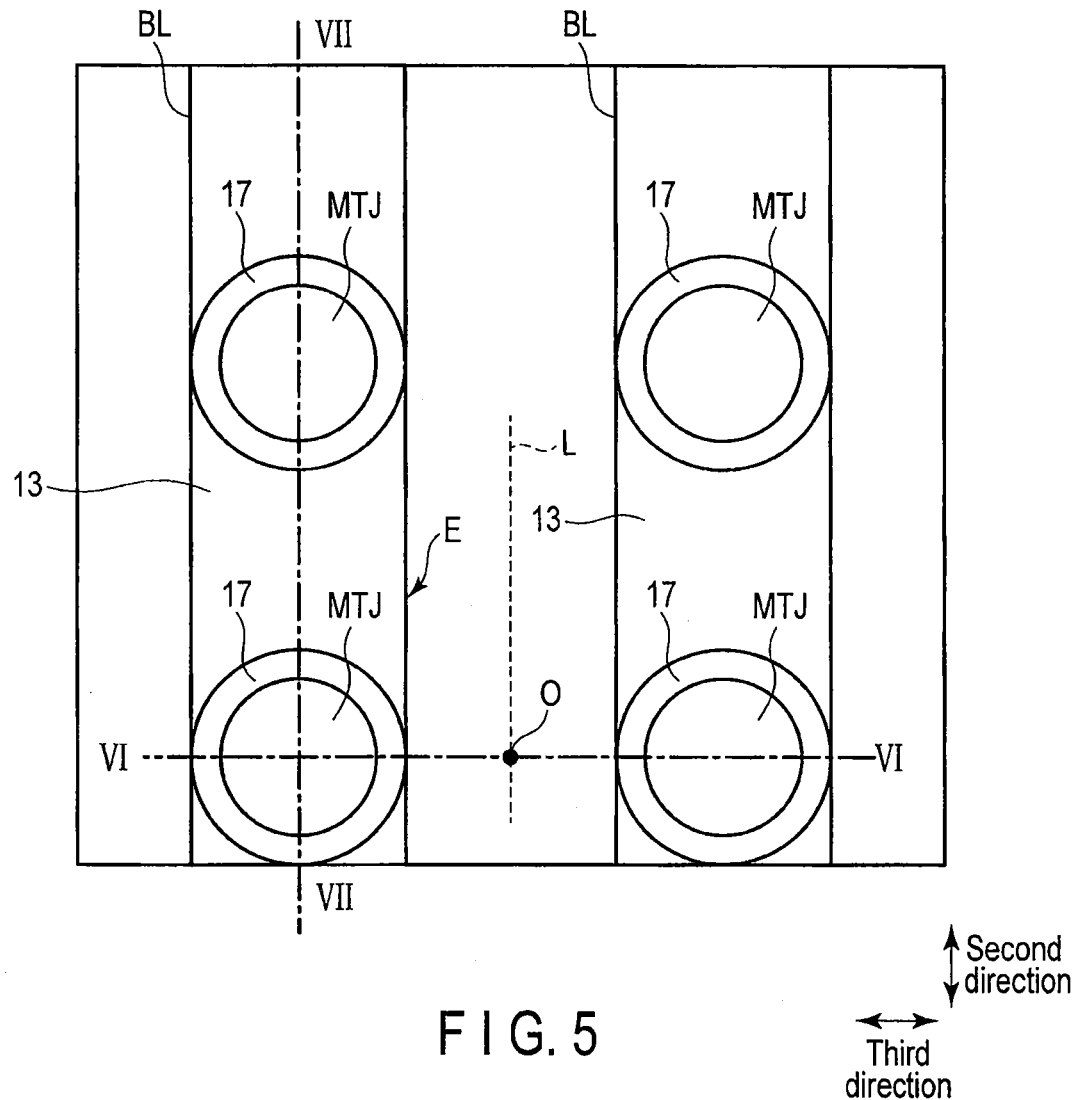
F I G. 5

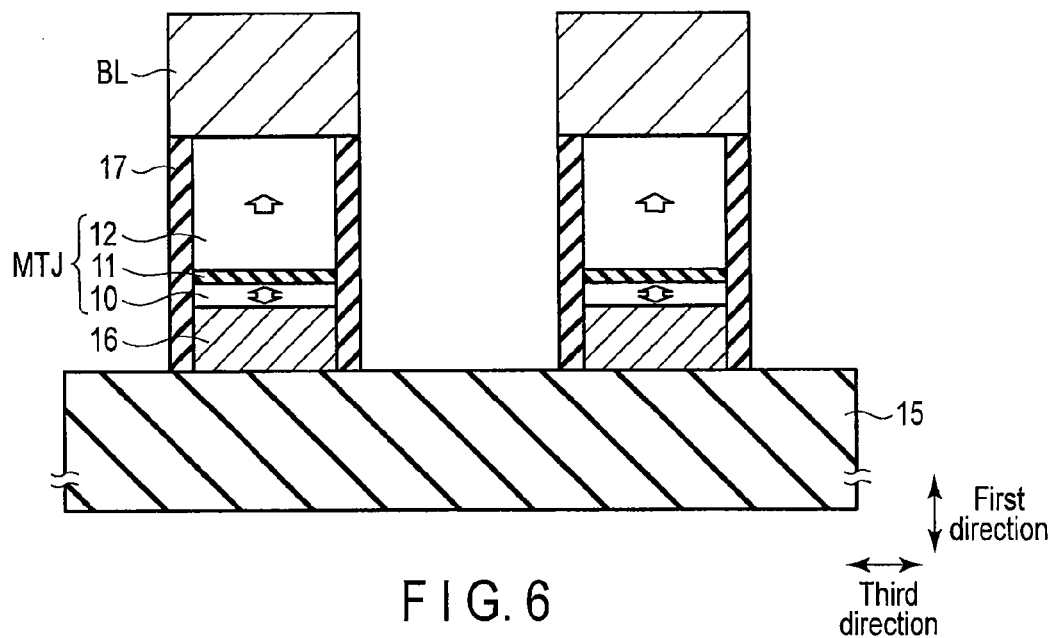
F I G. 6
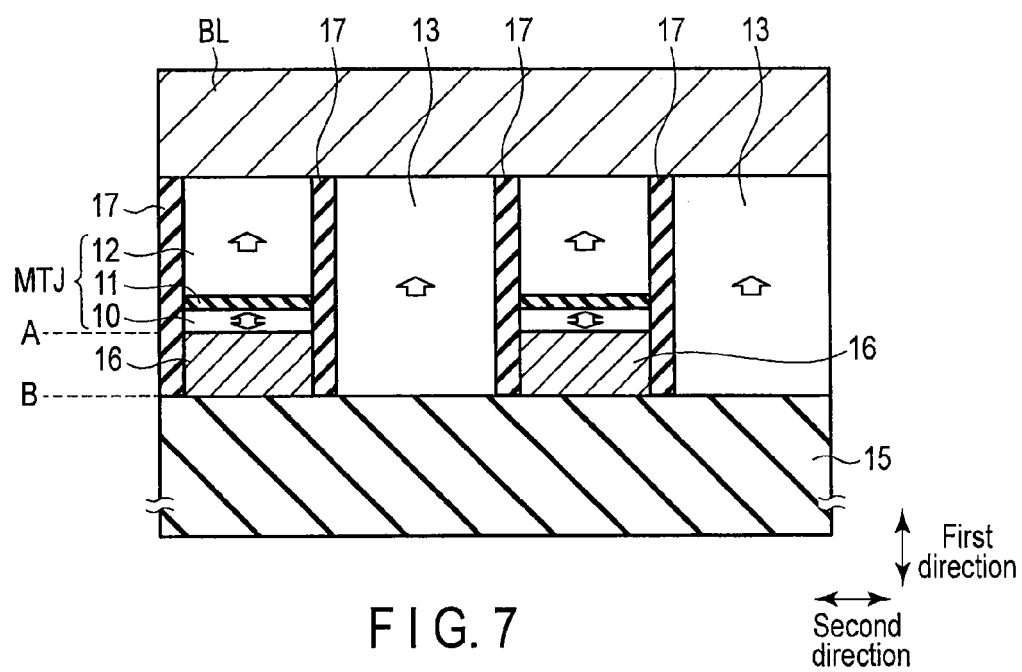
F I G. 7

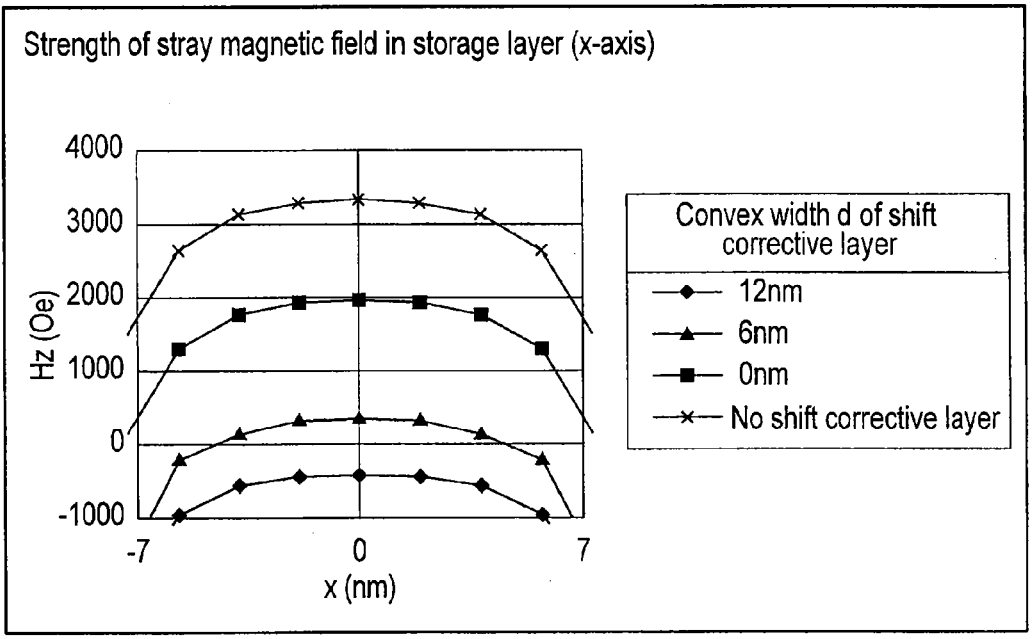
F I G. 9
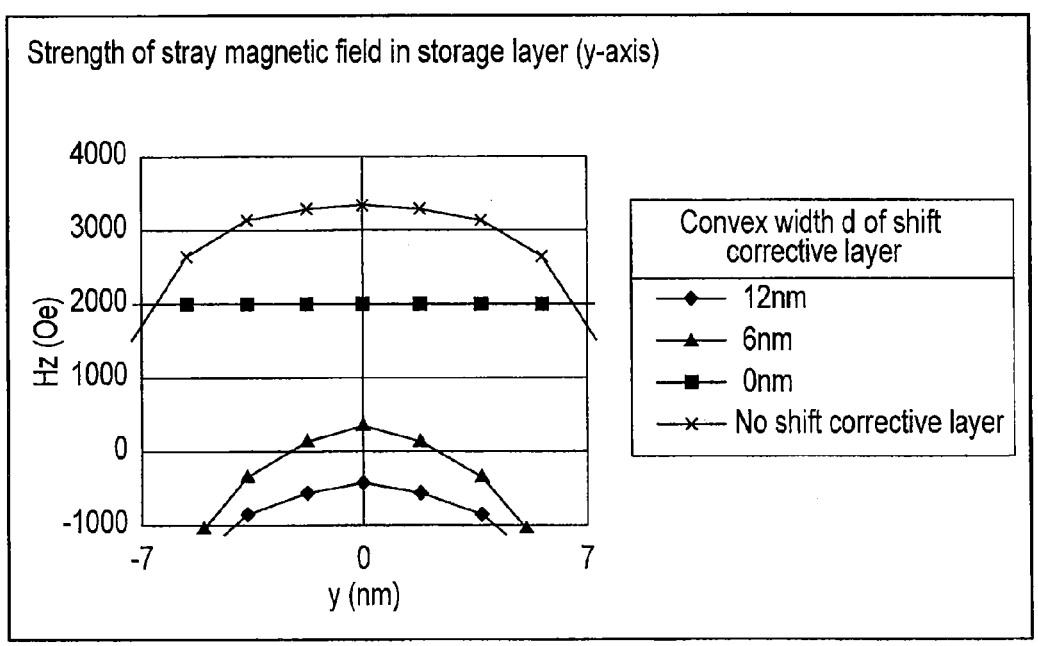
F I G. 10

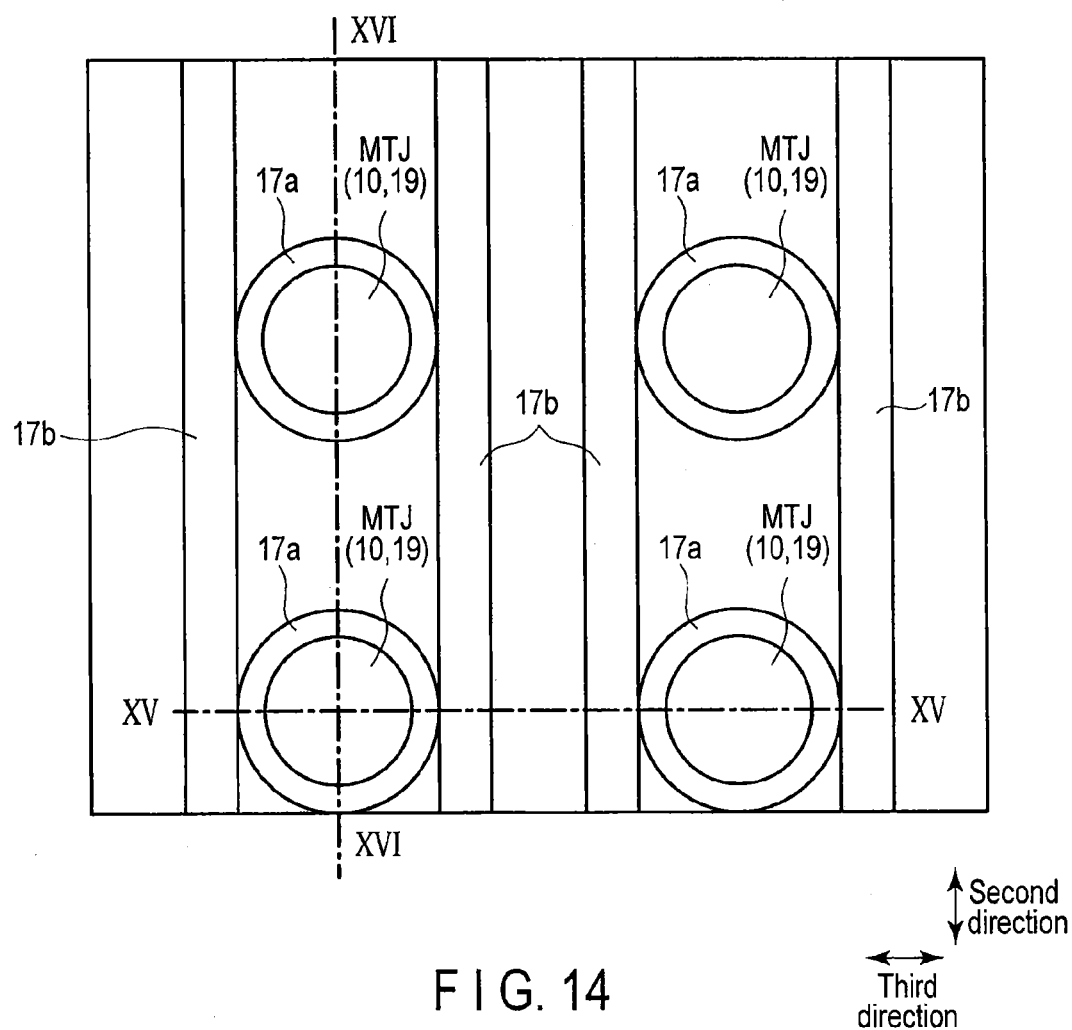
F I G. 14

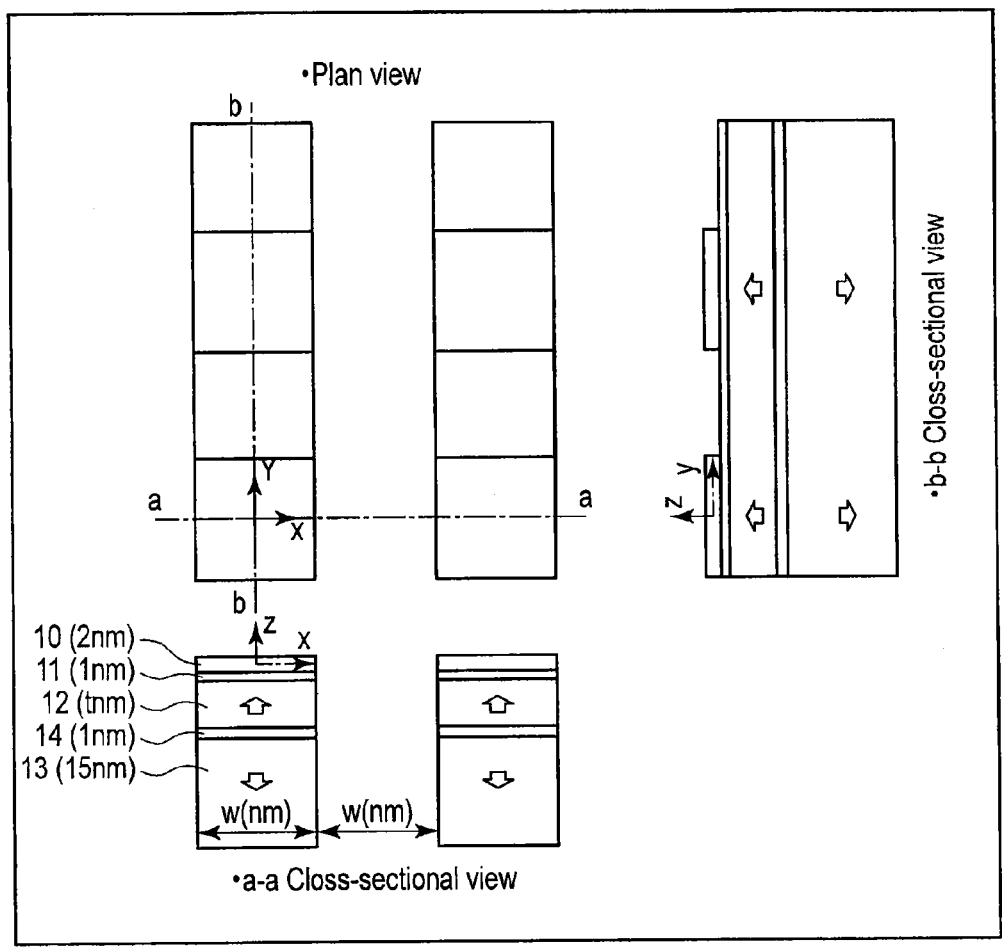
F I G. 17

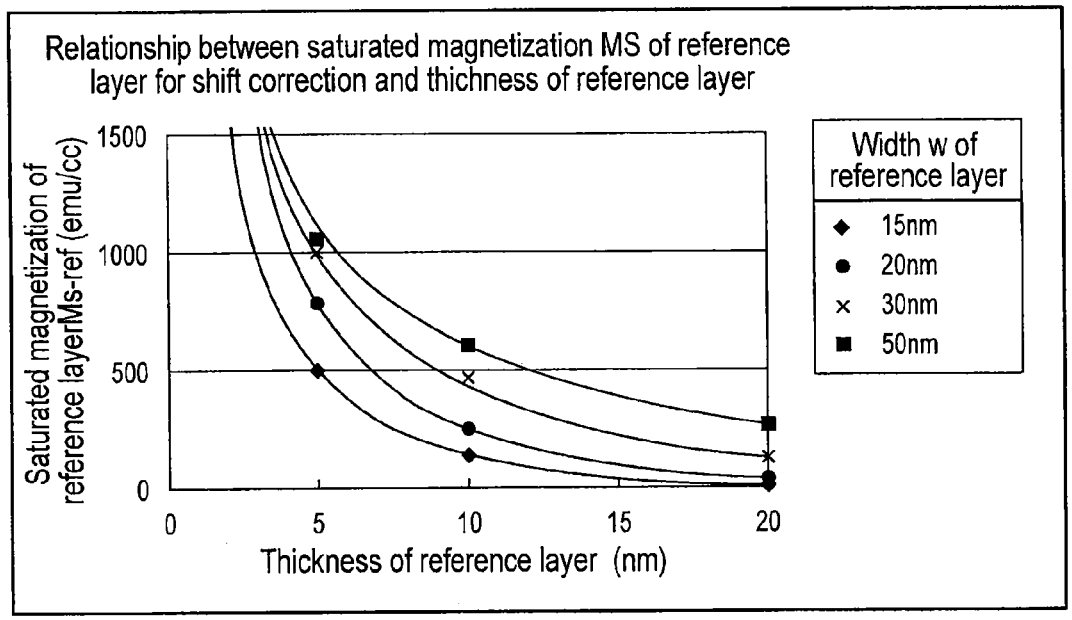
F I G. 25
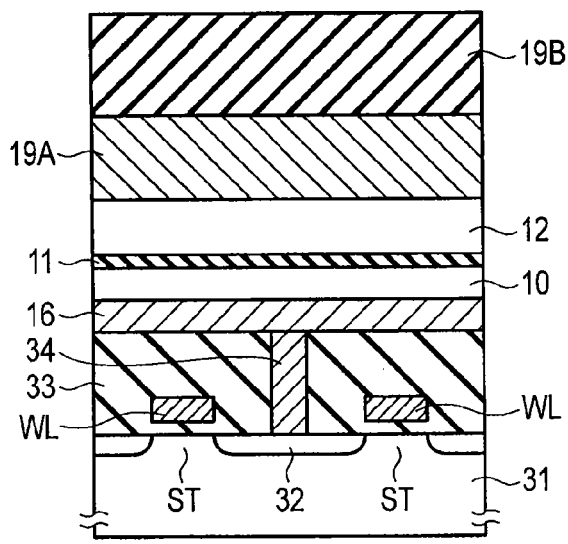
F I G. 26

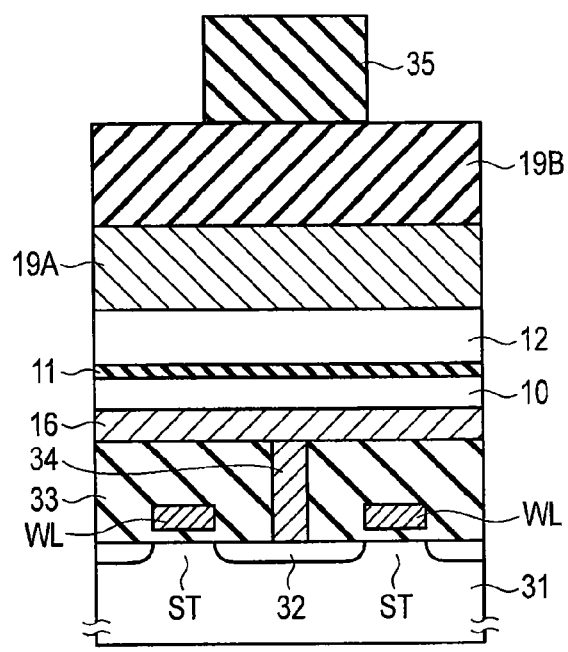
F I G. 27
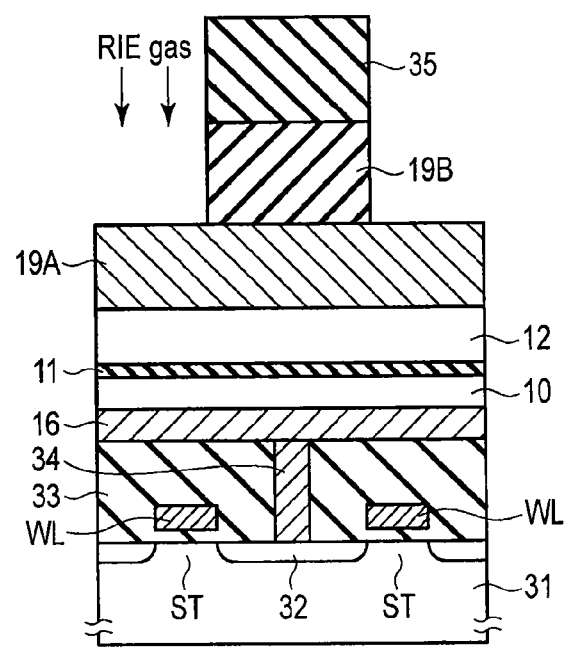
F I G. 28

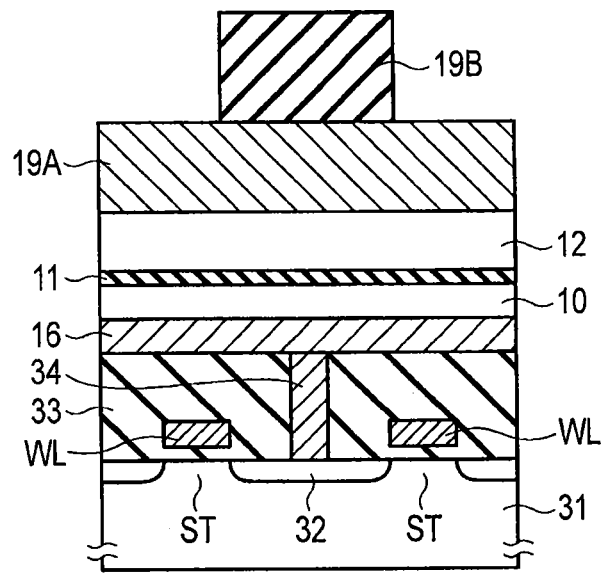
F I G. 29
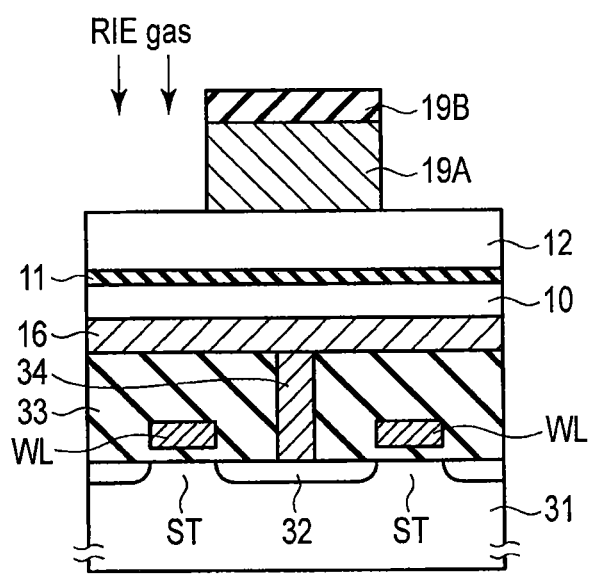
F I G. 30

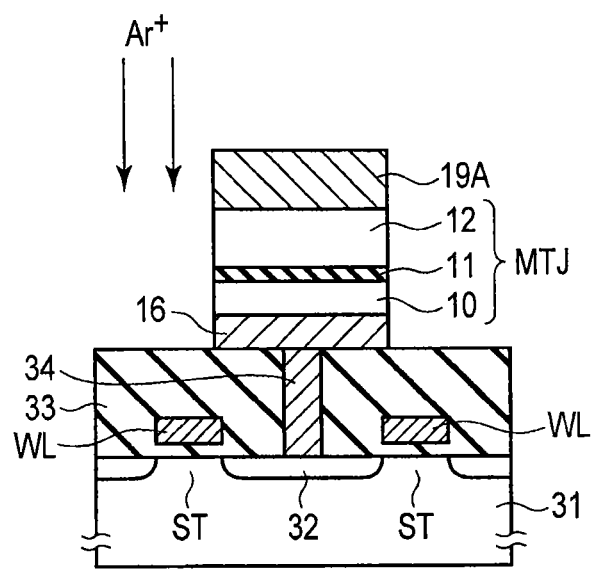
F I G. 31
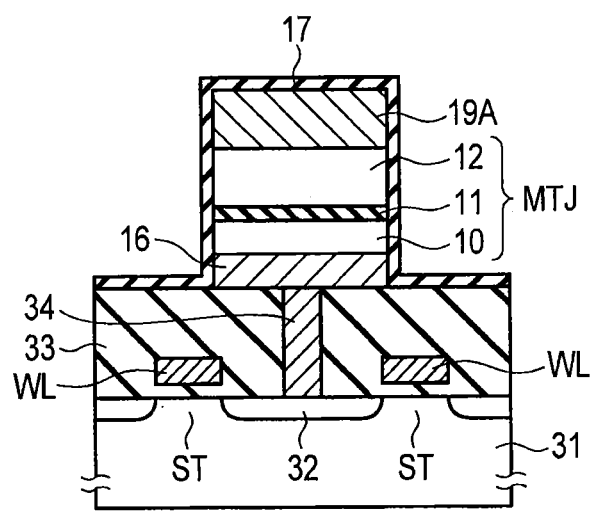
F I G. 32

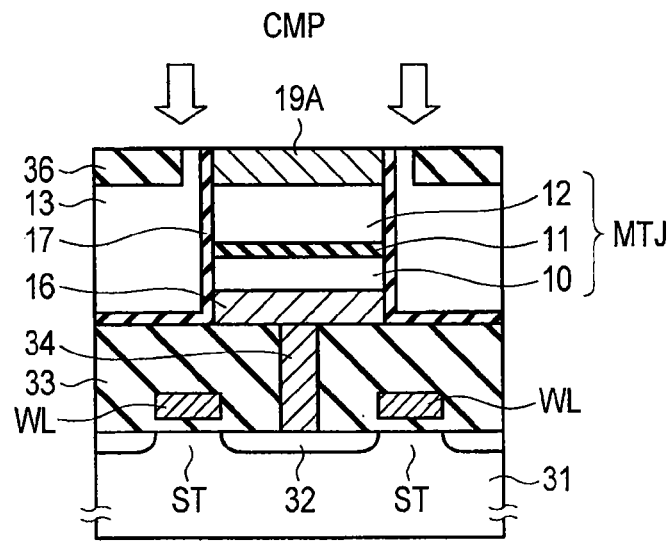
F I G. 35
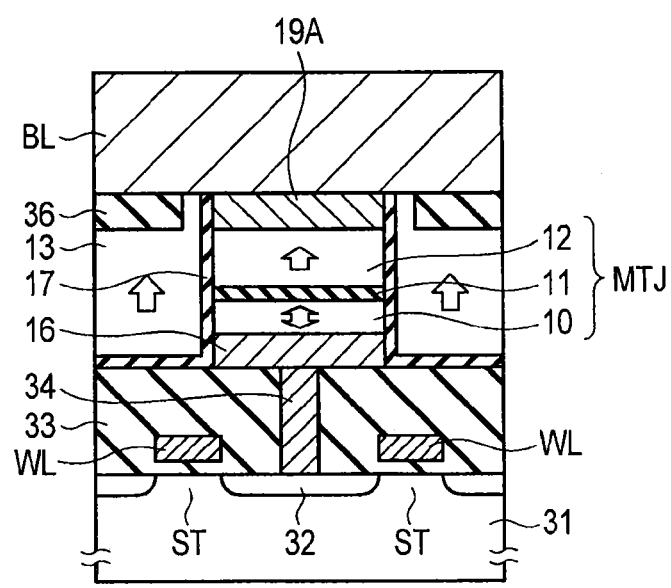
F I G. 36

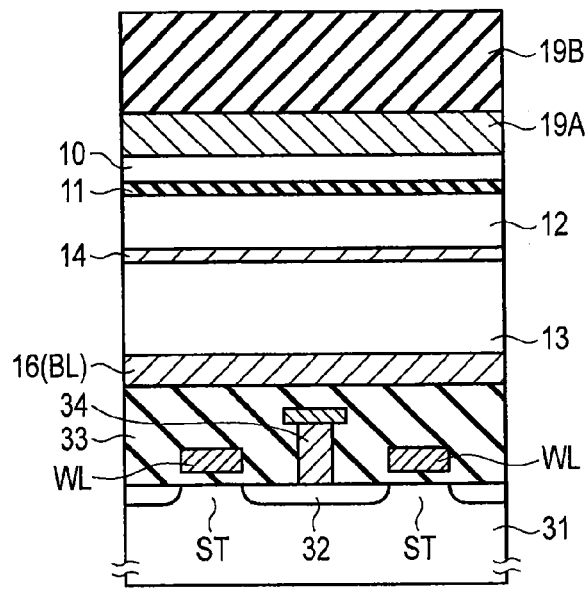
F I G. 37
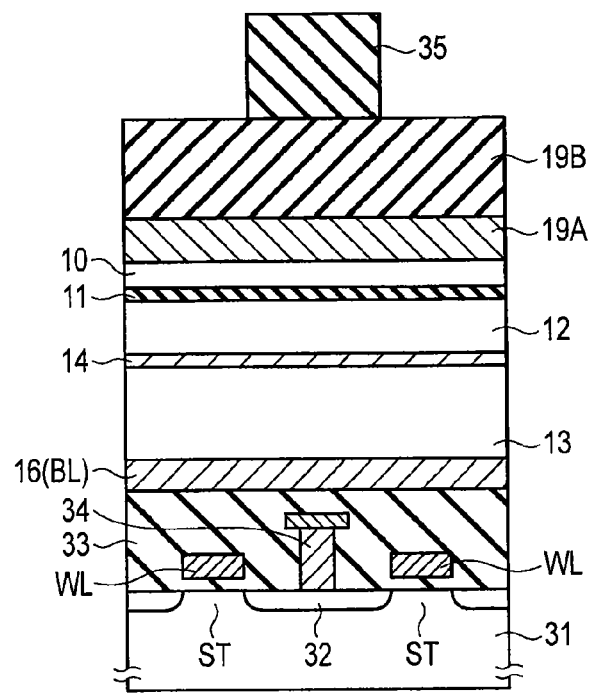
F I G. 38

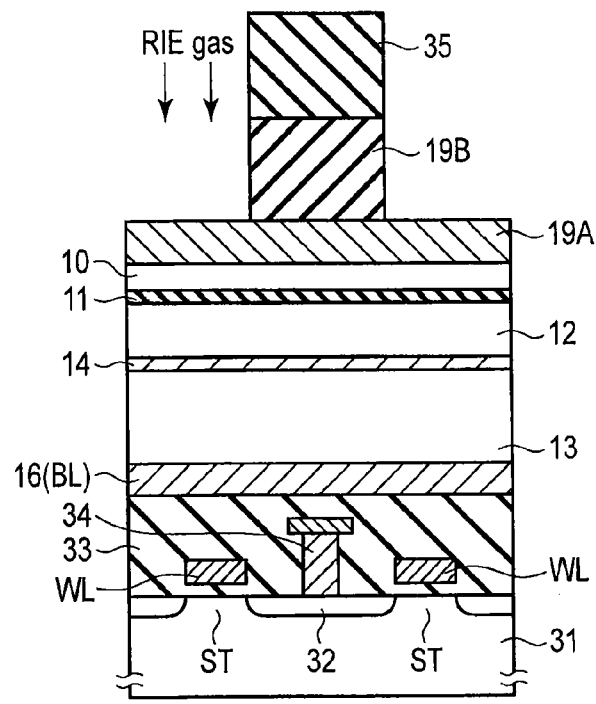
F I G. 39
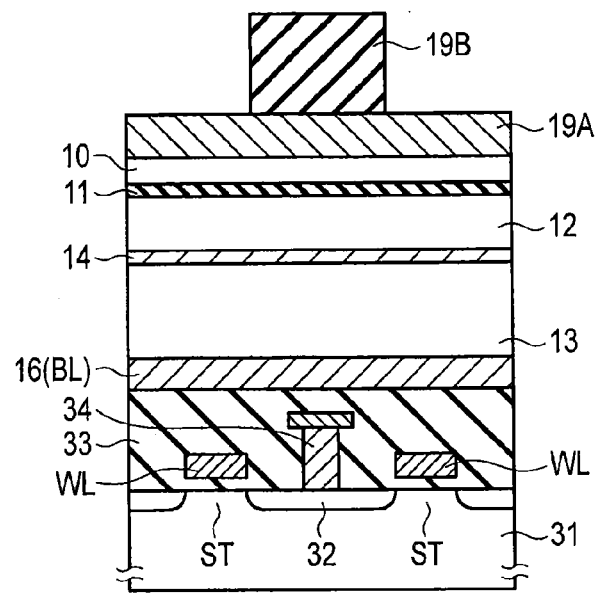
F I G. 40

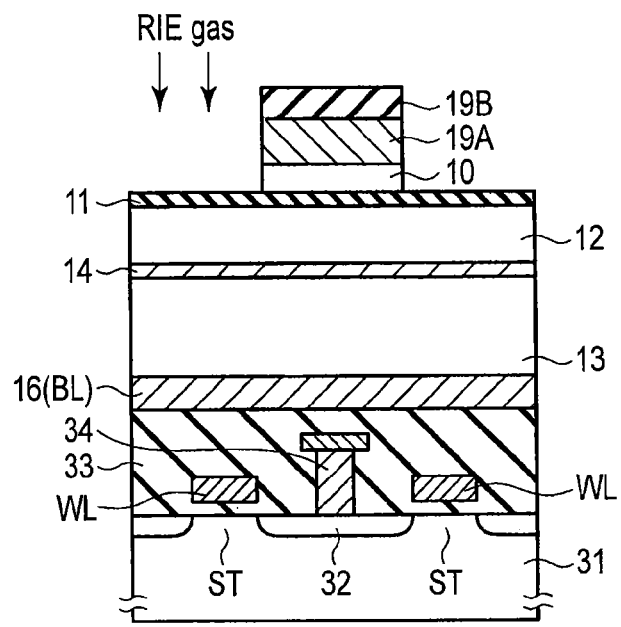
F I G. 41
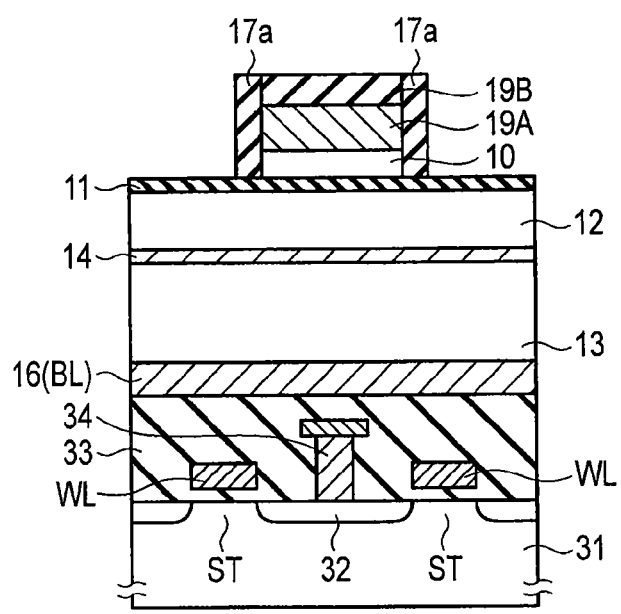
F I G. 42

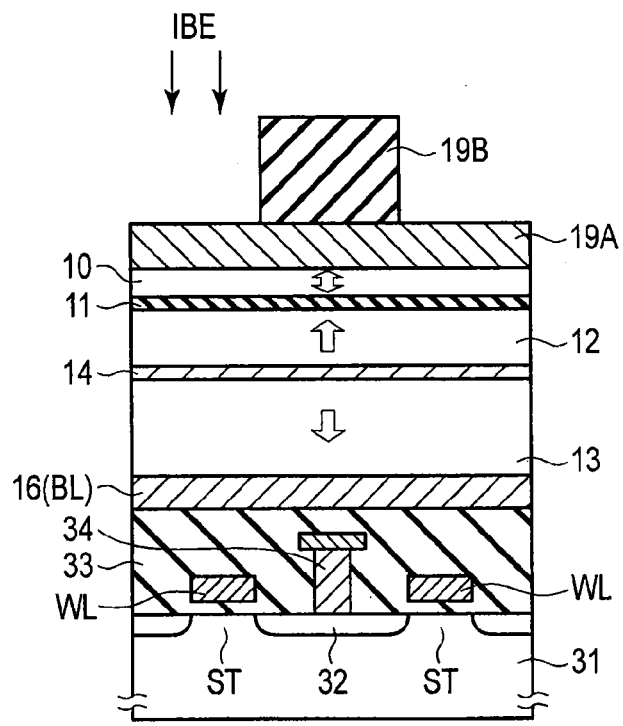
F I G. 45
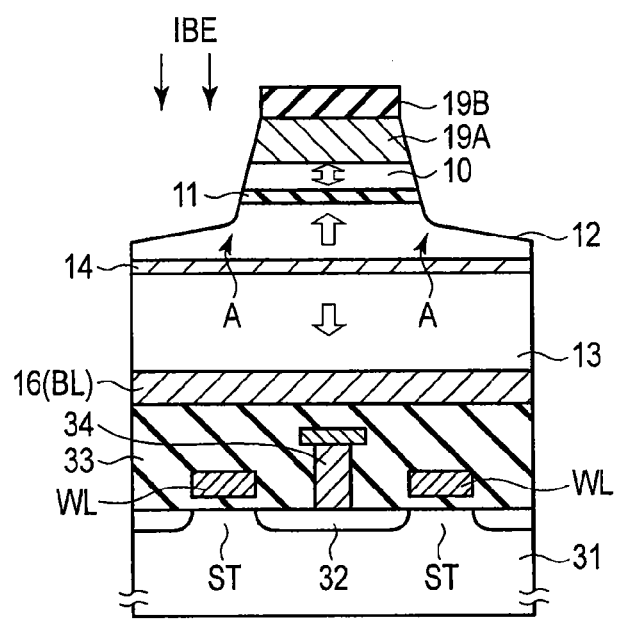
F I G. 46

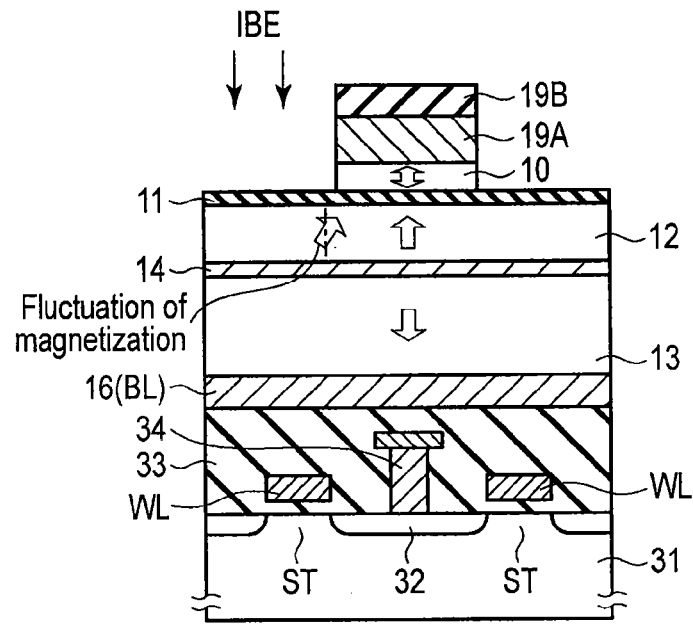
F I G. 47
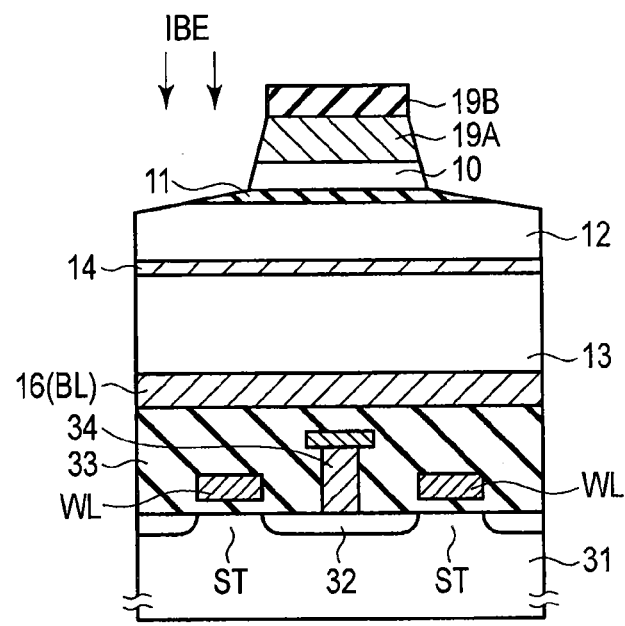
F I G. 48

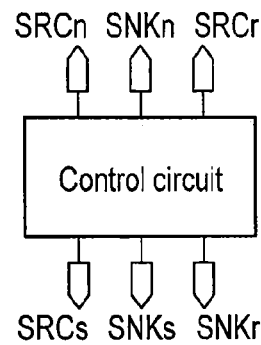
F I G. 50
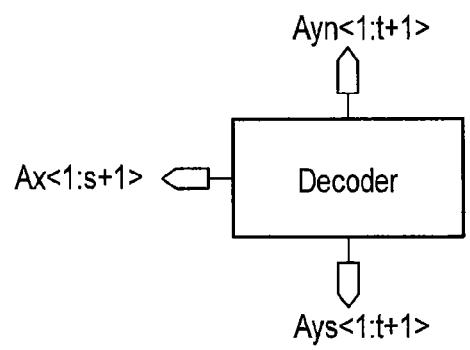
F I G. 51
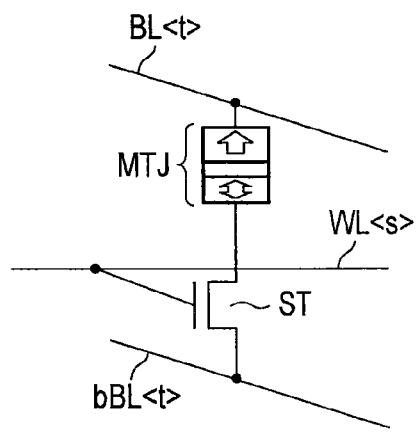
F I G. 52

MAGNETIC MEMORY

CROSS-REFERENCE TO RELATED APPLICATIONS

This application is based upon and claims the benefit of priority from Japanese Patent Application No. 2012-210980, filed Sep. 25, 2012, the entire contents of which are incorporated herein by reference.

FIELD

Embodiments described herein relate generally to a magnetic memory.

BACKGROUND

A magnetic memory, for example, a magnetic random access memory stores data in a magnetoresistive element. Moreover, the magnetoresistive element comprises a basic structure including, for example, a reference layer (a ferromagnetic layer) having a perpendicular and invariable magnetization, a storage layer (a ferromagnetic layer) having a perpendicular and variable magnetization, and a tunnel barrier layer (an insulating layer) between these layers.

Here, for example, when writing is performed by spin transfer, decreasing a value of a spin injection current required for magnetization reverse and preventing the reverse of written data can effectively be accomplished by returning, to an original state, a shift of a looped resistance (R)-magnetic field (H) curve (an RH curve) of the storage layer due to a stray magnetic field from the reference layer, i.e., by correcting the curve.

To correct this shift of the RH curve, a shift corrective layer (the ferromagnetic layer having an invariable magnetization) is used. This shift corrective layer is usually stacked on the reference layer in the magnetoresistive element of a top pin type (a structure in which the reference layer is disposed on the storage layer), to cancel the stray magnetic field applied to the storage layer by a corrective magnetic field.

However, when the magnetoresistive element is made to be finer, it is difficult for the shift corrective layer to correct the shift of the RH curve of the storage layer. This is because when a planar size of the reference layer decreases in accordance with the fineness, the stray magnetic field from the reference layer at the position of the storage layer increases, and on the other hand, the shift corrective layer is away from the storage layer as much as a thickness of the reference layer, and hence the corrective magnetic field from the shift corrective layer at the position of the storage layer becomes smaller than the stray magnetic field from the reference layer.

Therefore, on the assumption that the magnetoresistive element is made to be finer, for the purpose of canceling the stray magnetic field applied to the storage layer by the corrective magnetic field from the shift corrective layer, it is necessary to take measures such as decreasing a saturated magnetization of the reference layer to decrease the stray magnetic field, and making the reference layer thinner to increase the corrective magnetic field.

On the other hand, perpendicular magnetic anisotropic energy has to be increased so that the reference layer keeps the perpendicular magnetization. For this purpose, the reference layer needs to be thick to a certain degree, and hence it is difficult to cancel the stray magnetic field by forming the thin reference layer. That is, the saturated magnetization of the reference layer is preferably decreased so that the corrective magnetic field from the shift corrective layer cancels the stray magnetic field applied to the storage layer.

However, when the saturated magnetization of the reference layer is decreased, it is difficult to select a material constituting the reference layer, to establish process conditions, or the like.

BRIEF DESCRIPTION OF THE DRAWINGS

FIG. 1 is a view showing a magnetoresistive element;
FIG. 2 is a view showing the magnetoresistive element comprising a shift corrective layer;
FIG. 5 is a plan view of the structure of FIG. 4;
FIG. 6 is a cross-sectional view taken along the VI-VI line of FIG. 5;
FIG. 7 is a cross-sectional view taken along the VII-VII line of FIG. 5;
FIG. 9 and FIG. 10 are diagrams showing a strength of a stray magnetic field in a storage layer;
FIG. 14 is a plan view showing a third embodiment of the structure of the region X of FIG. 3;
FIG. 17 is a view showing a simulation model;
FIG. 25 is a diagram showing a relationship between a saturated magnetization of the reference layer and the thickness of the reference layer;
FIG. 26 to FIG. 48 are views showing a manufacturing method;
FIG. 50 is a view showing a control circuit;
FIG. 51 is a view showing a decoder;
FIG. 52 is a view showing a memory cell.

DETAILED DESCRIPTION

Figure 3:
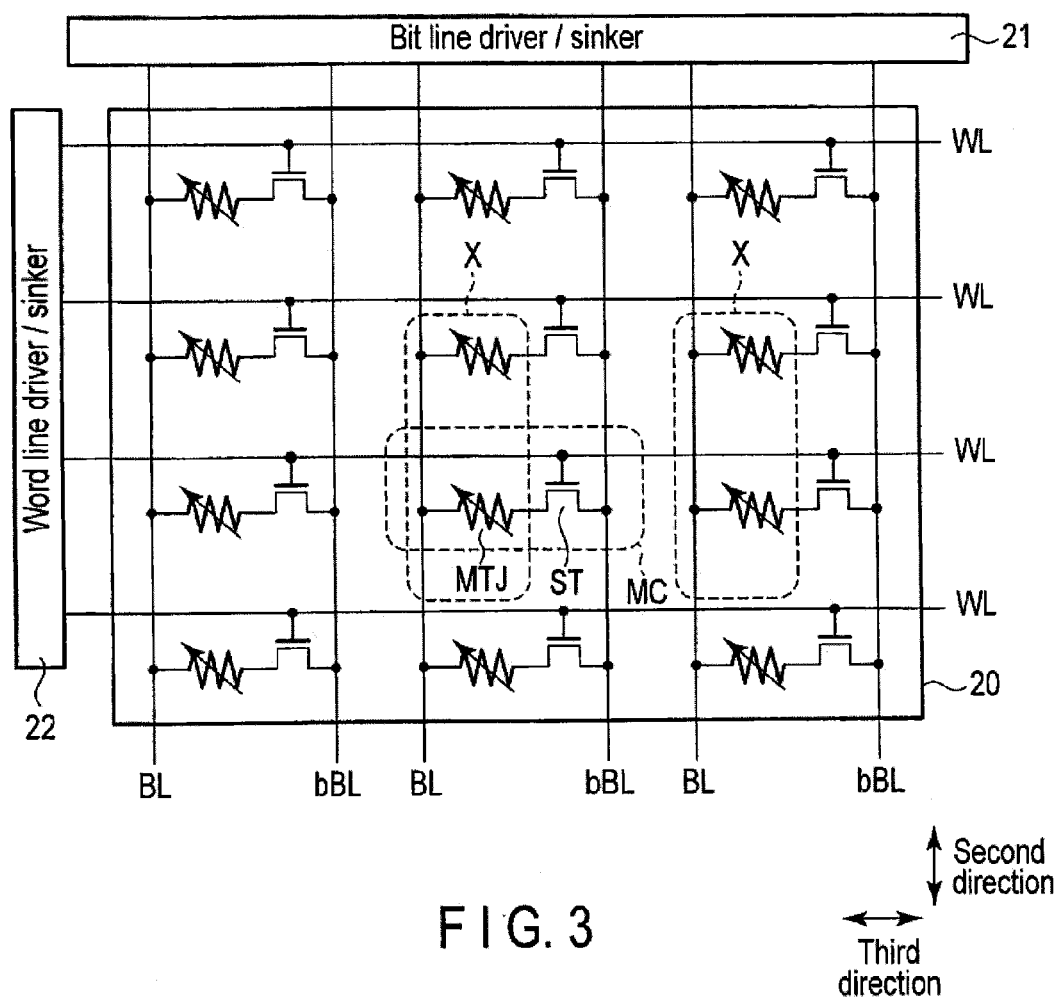
FIG. 3 is a view showing a magnetic memory.

In general, according to one embodiment, a magnetic memory comprising: a first magnetoresistive element comprising a storage layer with a perpendicular and variable magnetization, a tunnel barrier layer, and a reference layer with a perpendicular and invariable magnetization, and stacked in order thereof in a first direction; and a first shift corrective layer with a perpendicular and invariable magnetization, the first shift corrective layer and the storage layer arranged in a direction intersecting to the first direction, wherein magnetization directions of the reference layer and the first shift corrective layer are the same, and the first shift corrective layer projects to a side opposite to a side of the tunnel barrier layer more than a first surface of the storage layer opposite to a second surface of the storage layer beside to the tunnel barrier layer.

Hereinafter, embodiments will be described with reference to the drawings.

1. MAGNETORESISTIVE ELEMENT AND SHIFT CORRECTIVE LAYER

The following embodiments target at a magnetoresistive element with a perpendicular magnetization, which corrects shift of an RH curve of a storage layer by a shift corrective layer (shift cancelling layer). Therefore, first, the magnetoresistive element and the shift corrective layer will be described.

It is to be noted that in the present specification, the perpendicular magnetization means that a magnetization direction of a remanent magnetization of a ferromagnetic layer is perpendicular or substantially perpendicular to a film surface (an upper surface/a lower surface) of the ferromagnetic layer. The substantially perpendicular magnetization means that the magnetization direction of the remanent magnetization of the ferromagnetic layer is in a range of $45°<\theta \leq 90°$ to the film surface of the ferromagnetic layer.

FIG. 1 shows a basic structure of the magnetoresistive element.

Magnetoresistive element MTJ comprises a stacked structure in which storage layer (ferromagnetic layer) 10 with a perpendicular and variable magnetization, tunnel barrier layer (insulating layer) 11 and reference layer (ferromagnetic layer) 12 with a perpendicular and invariable magnetization are arranged in this order in a first direction.

Here, the invariable magnetization means that the magnetization direction does not change before and after writing, and the variable magnetization means that the magnetization direction can change in an opposite direction before and after the writing.

Moreover, the writing means spin transfer writing in which a spin injection current (spin-polarized electrons) is allowed to flow through magnetoresistive element MTJ to apply a spin torque to the magnetization of storage layer 10.

For example, when the spin injection current is allowed to flow from storage layer 10 toward reference layer 12, the electrons spin-polarized in the same direction as that of the magnetization of reference layer 12 are injected into storage layer 10, and the spin torque is applied to the magnetization in storage layer 10. Therefore, the magnetization direction of storage layer 10 is the same (parallel state) as the magnetization direction of reference layer 12.

Moreover, when the spin injection current is allowed to flow from reference layer 12 toward storage layer 10, the electrons spin-polarized in a direction opposite to the magnetization direction of reference layer 12 among the electrons flowing from storage layer 10 to reference layer 12 are returned into storage layer 10, and the spin torque is applied to the magnetization in storage layer 10. Therefore, the magnetization direction of storage layer 10 is opposite (anti-parallel state) to the magnetization direction of reference layer 12.

A resistance value of magnetoresistive element MTJ changes depending on the relative magnetization directions of reference layer 12 and storage layer 10, owing to a magnetoresistive effect. That is, the resistance value of magnetoresistive element MTJ decreases in the parallel state, and increases in the anti-parallel state. A value defined by (R1−R0)/R0 in which R0 is the resistance value in the parallel state and R1 is the resistance value in the anti-parallel state is called the magnetoresistive (MR) ratio.

The MR ratio changes in accordance with a material constituting magnetoresistive element MTJ, process conditions and the like, but this ratio is preferably set to be as large as possible, when stably performing reading/writing. This is because the parallel state/the anti-parallel state is assigned to, for example, "0"/"1" of data. At the present time, magnetoresistive element MTJ having an MR ratio of several 10% to several 100% is developed.

Additionally, in the present example, the magnetization of reference layer 12 is fixed while the magnetization is directed to the side of storage layer 10, but the magnetization may be fixed while the magnetization is directed to a side opposite to storage layer 10. Moreover, when magnetoresistive element MTJ is disposed on a semiconductor substrate, a vertical relationship between reference layer 12 and storage layer 10 is not limited.

For example, when reference layer 12 is present above storage layer 10, magnetoresistive element MTJ is called a top pin type, and when reference layer 12 is present below storage layer 10, magnetoresistive element MTJ is called a bottom pin type.

FIG. 2 shows a magnetoresistive element having a shift corrective layer.

Magnetoresistive element MTJ comprises a stacked structure in which storage layer (ferromagnetic layer) 10 with a perpendicular and variable magnetization, tunnel barrier layer (insulating layer) 11 and reference layer (ferromagnetic layer) 12 with a perpendicular and invariable magnetization are arranged in this order in a first direction.

Moreover, magnetoresistive element MTJ comprises shift corrective layer (ferromagnetic layer) 13 with a perpendicular and invariable magnetization on a side of reference layer 12. Nonmagnetic layer (e.g., metal layer) 14 is interposed between reference layer 12 and shift corrective layer 13.

In the present example, reference layer 12 and storage layer 10 have the perpendicular magnetization. In this case, a stray magnetic field from reference layer 12 turns toward the magnetization direction (the perpendicular direction) of storage layer 10, and hence the stray magnetic field having a large perpendicular component is applied to storage layer 10. This stray magnetic field acts in such a direction that the magnetization direction of storage layer 10 is the same (parallel state) as the magnetization direction of reference layer 12.

Therefore, the RH curve of storage layer 10 shifts.

That is, when magnetoresistive element MTJ is changed from the anti-parallel state to the parallel state, a small spin injection current is sufficiently allowed to flow through magnetoresistive element MTJ. On the other hand, when magnetoresistive element MTJ is changed from the parallel state to the anti-parallel state, a large spin injection current has to be allowed to flow through magnetoresistive element MTJ.

Moreover, the anti-parallel state becomes unstable owing to the stray magnetic field from reference layer 12.

That is, when the stray magnetic field is larger than a coercive force of storage layer 10, storage layer 10 cannot hold the anti-parallel state. Moreover, even when the stray magnetic field is smaller than the coercive force of storage layer 10, in consideration of fluctuation of the magnetization due to thermal agitation, the magnetization of storage layer 10 reverses from the anti-parallel state to the parallel state owing to the stray magnetic field sometimes.

Shift corrective layer 13 is disposed to solve such problems.

In the present example, reference layer 12 and shift corrective layer 13 are stacked on each other. In this case, the magnetization direction of shift corrective layer 13 is set to a direction opposite to the magnetization direction of reference layer 12. Consequently, in storage layer 10, the stray magnetic field from reference layer 12 is offset by a corrective magnetic field from shift corrective layer 13, and it is possible to correct the shift of the RH curve of storage layer 10.

However, when the magnetoresistive element is made to be finer, it becomes difficult for shift corrective layer 13 to correct the shift of the RH curve of storage layer 10. This is because when a planar size of the reference layer decreases owing to the fineness, the stray magnetic field from the reference layer at the position of the storage layer increases, but the shift corrective layer is disposed away form the storage layer as much as the thickness of the reference layer. Therefore, the corrective magnetic field from the shift corrective layer at the position of the storage layer becomes smaller than the stray magnetic field from the reference layer.

Moreover, on the assumption that the magnetoresistive element is made to be finer as described above, the saturated magnetization of reference layer 12 is decreased to decrease the stray magnetic field from reference layer 12, thereby offsetting the stray magnetic field applied to storage layer 10 by the corrective magnetic field from shift corrective layer 13, but these measures are not realistic because selection ranges of the material of reference layer 12 and process conditions are narrowed.

To solve the problem, in the following embodiments, there will be suggested a magnetic memory which can correct the shift of the RH curve of storage layer 10, even when the saturated magnetization of reference layer 12 is not decreased in accordance with the fineness of the magnetoresistive element.

2. MAGNETIC MEMORY

2.-1. Cell Structure

FIG. 3 shows a magnetic memory.

The drawing shows a cell structure in which one memory cell MC comprises one magnetoresistive element MTJ and one selection transistor ST. This cell structure is an example illustrated to explain an embodiment of a device structure described later so that the embodiment is easily understood, and it is not gist that the embodiment of the device structure is limited to this cell structure.

Therefore, needless to say, the embodiment of the device structure described later can be applied to a cell structure other than the cell structure shown in the drawing, for example, a cell structure in which one memory cell comprises one magnetoresistive element and two selection transistors, or a cell structure in which one magnetoresistive element is interposed between two conductive layers which intersect with each other.

Memory cell array 20 comprises memory cells MCs arranged in an array manner.

One memory cell MC comprises one magnetoresistive element MTJ and one selection transistor ST which are connected in series.

Moreover, memory cells MCs are connected between first bit line BL and second bit line bBL. In the present example, one end of each memory cell MC on a side of magnetoresistive element MTJ is connected to first bit line BL, and one end of each memory cell MC on a side of selection transistor ST is connected to second bit line bBL.

The first and second bit lines BL and bBL extend in a second direction, and one end of each bit line is connected to bit line driver/sinker 21. Bit line driver/sinker 21 allows the spin injection current (the direction of the current changes in accordance with a value of writing data) to flow through, for example, magnetoresistive element MTJ in one selected memory cell MC at the writing.

A control terminal (a gate electrode) of each memory cell MC on the side of selection transistor ST is connected to word line WL. Word line WL extends in a third direction, and has one end connected to word line driver 22. Word line driver 22 activates, for example, word line WL connected to one selected memory cell MC at the writing.

2.-2. First Embodiment

2.-2.-1. Structure

Figure 4:
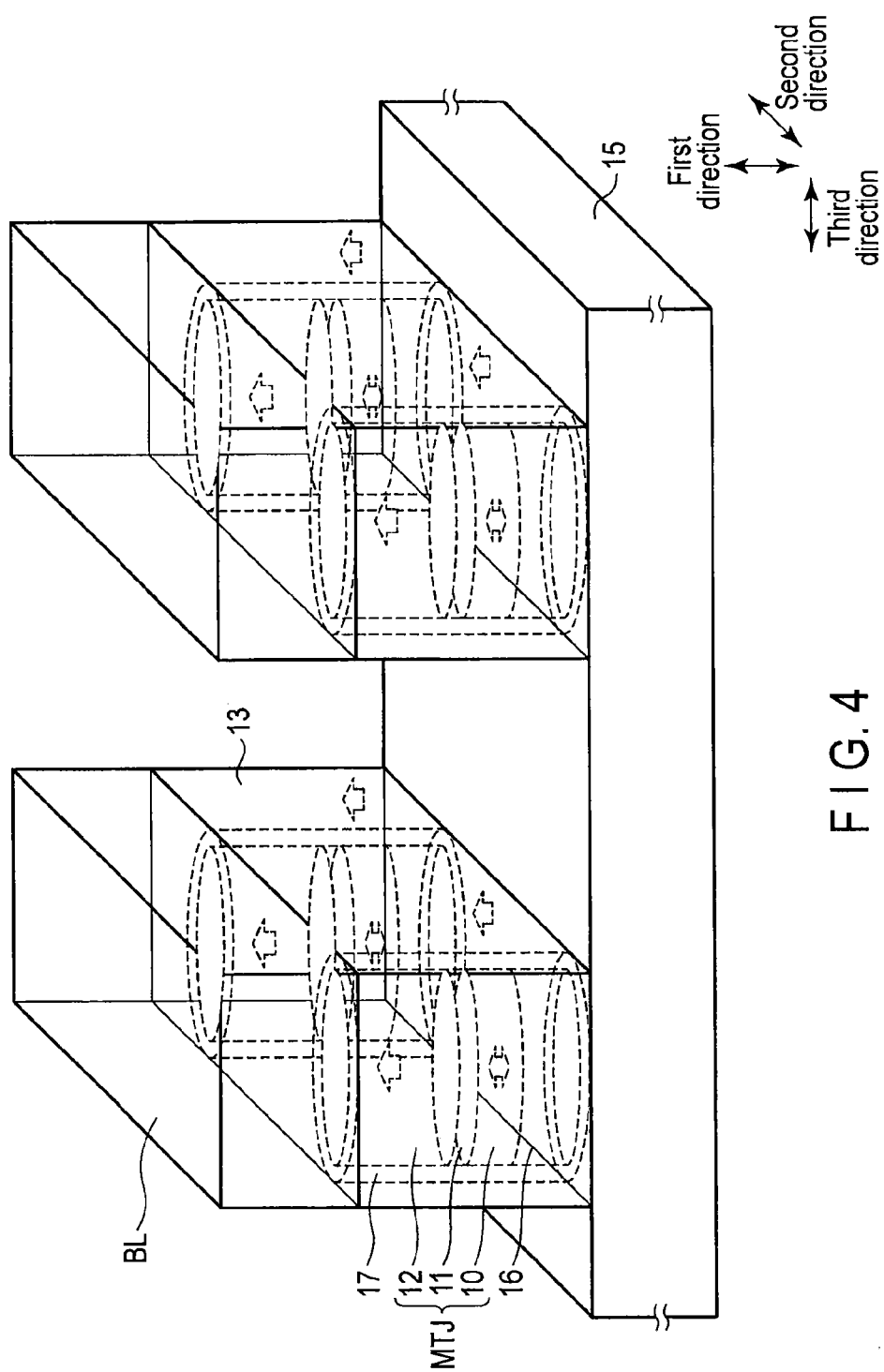
FIG. 4 is a perspective view showing a first embodiment of a structure of a region X of FIG. 3.

FIG. 4 shows a structure of region X of FIG. 3. Moreover, FIG. 5 is a plan view of the structure of FIG. 4, FIG. 6 is a cross-sectional view taken along the VI-VI line of FIG. 5, and FIG. 7 is a cross-sectional view taken along the VII-VII line of FIG. 5.

This structure has characteristics at the position of shift corrective layer 13.

Insulating layer 15 is, for example, a silicon oxide layer. Selection transistors of memory cells are arranged on, for example, a semiconductor substrate, and covered with insulating layer 15. Lower electrodes 16 are arranged on insulating layer 15. Magnetoresistive elements MTJs are arranged on lower electrodes 16, respectively.

Each of lower electrodes 16 is connected to a predetermined conductive layer so that a current path extending through magnetoresistive element MTJ disposed on each lower electrode is generated. For example, each lower electrode 16 is connected to the selection transistor on the semiconductor substrate through a via-hole, and the selection transistor is further connected to a bit line.

Each of magnetoresistive elements MTJs comprises a stacked structure in which storage layer 10 with a perpendicular and variable magnetization, tunnel barrier layer 11 and reference layer 12 with a perpendicular and invariable magnetization are arranged in this order in a first direction. Moreover, magnetoresistive elements MTJs are arranged in an array manner in second and third directions.

Side surfaces (surfaces present in the second and third directions and a surface present between the surfaces) of magnetoresistive elements MTJs are covered with protective layers 17. Each of protective layers 17 comprises an insulating layer such as a silicon nitride layer.

Protective layer 17 needs to cover the whole side surface of storage layer 10, but may cover the whole side surface of reference layer 12 or an only part of the side surface of the reference layer. That is, when protective layer 17 covers the only part of the side surface of reference layer 12, reference layer 12 and shift corrective layer 13 may come in contact with each other.

Protective layer 17 may comprise a single layer or layers.

Shift corrective layer 13 faces storage layer 10 of magnetoresistive element MTJ in at least a direction orthogonal to the first direction, and has a perpendicular and invariable magnetization. In the present embodiment, shift corrective layer 13 is disposed around magnetoresistive element MTJ, and around at least storage layer 10 of magnetoresistive element MTJ. The magnetization direction of shift corrective layer 13 is the same as the magnetization direction of reference layer 12.

Shift corrective layer 13 is disposed right beside storage layer 10, and hence even when the saturated magnetization of the reference layer is not decreased in accordance with the fineness, shift corrective layer 13 can correct the shift of the RH curve of storage layer 10.

In the present embodiment, both the magnetization directions of reference layer 12 and shift corrective layer 13 are upward, but these directions can be changed to downward directions.

Moreover, end E of shift corrective layer 13 in the third direction passes through center O of a space between two magnetoresistive elements MTJs adjacent to each other in the third direction, and is positioned on an inner side from line L extending in the second direction. For example, a width of shift corrective layer 13 in the third direction is about the same as a width of each bit line BL in the third direction.

Therefore, shift corrective layer 13 does not become a restriction on reduction of a line&space pitch of bit lines BLs.

Here, when the width of shift corrective layer 13 is about the same as that of the bit line, there are included both a case where side surfaces of shift corrective layer 13 and each bit line BL in the third direction are perpendicular to an upper surface of insulating layer 15 and a case where the side surfaces are oblique (tapered) to the upper surface of insulating layer 15.

A positional relationship between storage layer 10 and shift corrective layer 13 will be verified.

Each of storage layer 10 and shift corrective layer 13 comprises, in the first direction, a first surface (an upper surface) on the side of reference layer 12, and a second surface (a lower surface) on a side opposite to the side of reference layer 12. The second surface of storage layer 10 is denoted with, for example, "A" in FIG. 7.

In this case, the second surface (the lower surface) of shift corrective layer 13 preferably projects to the side (the lower side) opposite to the side of reference layer 12 more than second surface (lower surface) A of storage layer 10. This is because the whole side surface of storage layer 10 is surrounded with shift corrective layer 13, to easily correct the shift of the RH curve of storage layer 10.

It is to be noted that a convex width of shift corrective layer is from second surface (lower surface) A of storage layer 10 to the upper surface (denoted with "B" in FIG. 7) of insulating layer 15 at maximum in the device structure.

A simulation result of the convex width will be described later.

Bit lines (conductive layers) BLs extend in the second direction, and are connected in common to magnetoresistive elements MTJs arranged in the second direction.

In the present embodiment, a direction in which shift corrective layer 13 is disposed to storage layer 10 is the same as the second direction in which bit lines BLs extend. However, these two directions may be different from each other. That is, in the present embodiment, to correct the shift of the RH curve of storage layer 10, shift corrective layer 13 may face storage layer 10 of magnetoresistive element MTJ in at least the direction orthogonal to the first direction.

Moreover, respective bit lines BLs are connected to reference layers 12 and shift corrective layers 13 of magnetoresistive elements MTJs. However, respective bit lines BLs may be insulated from shift corrective layers 13. Furthermore, between each of magnetoresistive elements MTJs and each of bit lines BLs, a cap layer, a hard mask layer and a conductive layer such as a via-hole may be arranged.

In the present embodiment, the space is formed between magnetoresistive elements MTJs, but, for example, an interlayer insulating layer is buried in this space. For the burying of the interlayer insulating layer, various methods are suggested, but the methods are not essential conditions in describing the characteristics of the present embodiment, and hence the description of the burying method is omitted here.

An example of the interlayer insulating layer will be described later in a manufacturing method.

Moreover, a base of shift corrective layer 13 is insulating layer 15, but a base electrode (e.g., the same material as in base electrode 16) may be interposed between shift corrective layer 13 and insulating layer 15 for the purpose of improvement of crystallinity of a magnetic film constituting shift corrective layer 13, or the like.

However, in this case, it is necessary to insulate a base electrode as a base of shift corrective layer 13 and base electrode 16 of magnetoresistive element MTJ from each other.

Moreover, the width of shift corrective layer 13 in the third direction is preferably about the same as or larger than the width of magnetoresistive element MTJ in the third direction.

2.-2.-2. Material Example

Material examples of respective elements in the structure of FIG. 4 to FIG. 7 will be described.

Insulating layer 15 and protective layer 17 comprise an insulating material such as $SiO_2$, Si—N, SiON, Al—O, or MgO. Lower electrode 16 comprises a metal or a conductive material such as Ta, W, Nb, Mo, Ti, TiN, WN, Cu, or CuN.

As storage layer 10 and reference layer 12 with the perpendicular magnetization, a ferromagnetic material or a ferrimagnetic material is used, and the layers comprise, for example, Fe, Co, Ni, Mn, or a compound including at least one of these materials.

For example, storage layer 10 as the downside comprises a structure in which a layer made of Pd (a thickness of 0.4 nm) and Co (a thickness of 0.4 nm) is stacked twice, and Ta (a thickness of 0.3 nm) and CoFeB (a thickness of 1 nm) on this structure. Moreover, reference layer 12 as the upside comprises a structure in which a layer made of CoFeB (a thickness of 1 nm), Pd (a thickness of 0.4 nm) and Co (a thickness of 0.4 nm) is stacked ten times.

Storage layer 10 and reference layer 12 have a magnetization easy axis in a perpendicular direction to the film surface owing to crystal magnetic anisotropy or interface magnetic anisotropy. Moreover, perpendicular magnetic anisotropy can be realized by an artificial lattice structure in which a magnetic layer and a non-magnetic layer are stacked.

Moreover, storage layer 10 and reference layer 12 are stacked layers of the magnetic layer with the perpendicular magnetic anisotropy and the magnetic layer with in-plane magnetic anisotropy, but as the whole layer, a perpendicularly magnetized film may be used in which the magnetization direction is perpendicular to the film surface.

As tunnel barrier layer 11, a thin film made of an insulating material is used, and the layer has, for example, a bodycentered cubic lattice (BCC) structure and comprises MgO (a thickness of 1 nm) aligned with the (001) face.

As shift corrective layer 13 with the perpendicular magnetization, a ferromagnetic material or a ferri-magnetic material is used, and the layer comprises, for example, Fe, Co, Ni, Mn, or a compound including at least one of these materials. For example, shift corrective layer 13 comprises a structure in which a layer made of Pd (a thickness of 0.4 nm) and Co (a thickness of 0.4 nm) is stacked 20 times.

Bit line (conductive layer) BL comprises a metal such as Al, Cu or W. Moreover, bit line-BL may comprise the magnetic layer, or the stacked structure of the magnetic layer and the non-magnetic layer. When bit line BL includes the magnetic layer, the magnetization direction of the magnetic layer is preferably the same as the magnetization direction of shift corrective layer 13.

2.-2.-3. Simulation Result of Convex Width

Next, there will be verified the effect that when the structure of the first embodiment is employed, in the storage layer, the stray magnetic field from the reference layer is canceled by the corrective magnetic field from the shift corrective layer.

A device model as an object of this simulation will be described.

Figure 8:
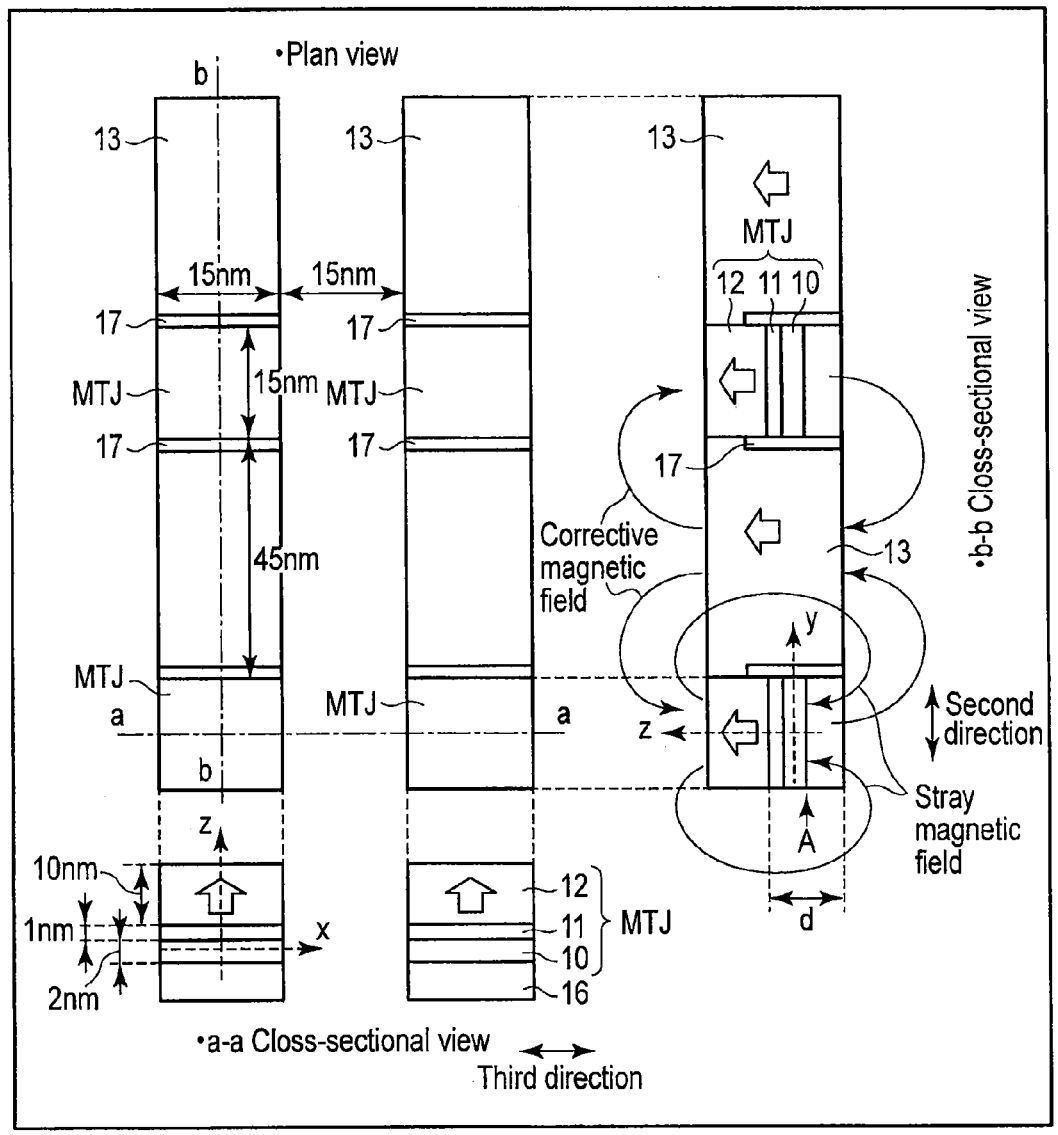
FIG. 8 is a view showing a simulation model.

FIG. 8 shows the device model.

In the drawing, the same elements as those of FIG. 4 to FIG. 7 are denoted with the same reference marks.

A memory cell array region is a square of 20 μm×20 μm, and in this memory cell array region, magnetoresistive elements MTJs are regularly arranged at a pitch of 60 nm in the second direction and a pitch of 30 nm in the third direction.

A planar shape of magnetoresistive element MTJ is a square of 15 nm×15 nm. In this case, a space between two magnetoresistive elements MTJs in the second direction is 45 nm, and a space between two magnetoresistive elements MTJs in the third direction is 15 nm.

Thicknesses of storage layer 10, tunnel barrier layer 11 and reference layer 12 of magnetoresistive element MTJ are 2 nm, 1 nm, and 10 nm, respectively.

The space between two magnetoresistive elements MTJs in the second direction is filled with shift corrective layer 13. Moreover, each of storage layer 10, reference layer 12 and shift corrective layer 13 has the perpendicular magnetization, and each of the magnetization directions of reference layer 12 and shift corrective layer 13 is upward.

Moreover, a width from the lower surface of storage layer 10 to the lower surface of shift corrective layer 13 is convex width d of shift corrective layer 13. Both saturated magnetizations Ms of reference layer 12 and shift corrective layer 13 are Ms=1000 emu/cc.

It is to be noted that the drawing shows only four magnetoresistive elements (2×2) MTJs, but such magnetoresistive elements MTJs are laid all over the memory cell array region.

On the basis of such a model, a strength of the stray magnetic field in storage layer 10 is calculated. Additionally, the strength of the stray magnetic field here means a value obtained by subtracting the strength of the corrective magnetic field from shift corrective layer 13 from the strength of the stray magnetic field from reference layer 12, in storage layer 10.

Moreover, the strength of the stray magnetic field in storage layer 10 is calculated in an orthogonal coordinate system in which the center of storage layer 10 is an origin, the first direction (the perpendicular direction) is a z-axis, the second direction is a y-axis, and the third direction is an x-axis.

FIG. 9 and FIG. 10 show calculation results of the strength of the stray magnetic field in the storage layer.

To correct the shift of the RH curve of storage layer 10, in storage layer 10, the stray magnetic field from reference layer 12 needs to be canceled by the corrective magnetic field from shift corrective layer 13. Here, when the stray magnetic field is canceled, it is meant that an average value of the strength of the stray magnetic field in storage layer 10 is substantially zero.

In these drawings, the magnetic field strength on the x-axis and the magnetic field strength on the y-axis are verified, respectively, by using convex width d of shift corrective layer 13 as a parameter.

First, when the magnetic field strength with no shift corrective layer 13 was verified as a reference example, the average value of the strength (upward) of the stray magnetic field in storage layer 10 was 3000 [Oe].

The strength of the stray magnetic field from reference layer 12 has such a sufficient size as to fix the magnetization of storage layer 10 in an upward direction. That is, when shift corrective layer 13 is not present, the magnetization direction of storage layer 10 is invariable. Therefore, the above-mentioned device model cannot be operated as the magnetic memory.

Next, convex width d of shift corrective layer 13 is changed, and it is verified whether or not the stray magnetic field in storage layer 10 can be canceled in the above-mentioned device model.

When convex width d of shift corrective layer 13 is 0 nm, the average value of the strength (upward) of the stray magnetic field in storage layer 10 is smaller than that at the time when shift corrective layer 13 is not present, but the average value still remains to be about 2000 [Oe]. This value has such a sufficient size as to fix the magnetization of storage layer 10 in the upward direction.

Therefore, when convex width d of shift corrective layer 13 is 0 nm, the magnetization direction of storage layer 10 is invariable, and hence the above-mentioned device model cannot be operated as the magnetic memory.

Moreover, when convex width d of shift corrective layer 13 is 6 nm, the average value of the strength of the stray magnetic field in storage layer 10 is substantially zero. Therefore, the above-mentioned device model can be operated as the magnetic memory, when convex width d of shift corrective layer 13 is about 6 nm.

On the other hand, when convex width d of shift corrective layer 13 is 12 nm, the strength (downward) of the corrective magnetic field is sufficiently larger than the strength (upward) of the stray magnetic field. In storage layer 10, a magnetic field strength (downward) of about −1000 [Oe] is present owing to the corrective magnetic field from shift corrective layer 13.

In this case, the magnetization of storage layer 10 is stable in a downward direction, and becomes unstable in the upward direction, and hence the device model is unsuitably operated as the magnetic memory.

It is seen from the above result that in the above-mentioned device model, when convex width d of shift corrective layer 13 is set to a value of about 6 nm, for example, a value in a range of 5 nm to 9 nm, the shift of the RH curve of storage layer 10 can be corrected.

Moreover, even when conditions of the above-mentioned device model are changed, the shift of the RH curve of storage layer 10 can be corrected simply by changing the range of convex width d of shift corrective layer 13.

Furthermore, it is seen from this simulation that in magnetoresistive element MTJ having a planar size of 20 nm or less (15 nm in the present embodiment), even when saturated magnetizations Ms of reference layer 12 and shift corrective layer 13 are the same (Ms=1000 emu/cc in the present embodiment), the shift of the RH curve of storage layer 10 can sufficiently be corrected.

This is a very advantageous effect, as the memory cells of the magnetic memory are made to be finer from now on. That is, an influence of the stray magnetic field from reference layer 12 which is exerted on storage layer 10 tends to increase owing to the fineness. To prevent this tendency, saturated magnetization Ms of reference layer 12 needs to be made smaller.

However, when saturated magnetization Ms of reference layer 12 is decreased, the perpendicular magnetic anisotropy decreases, and consequently, saturated magnetization Ms of reference layer 12 cannot be decreased.

According to the structure of the first embodiment, shift corrective layer 13 is present between two magnetoresistive elements MTJs arranged in the second direction (the direction in which the bit lines extend). Therefore, even when saturated magnetization Ms of reference layer 12 is not decreased in accordance with the fineness, the shift of the RH curve of storage layer 10 can be corrected by the corrective magnetic field from shift corrective layer 13.

It is to be noted that saturated magnetization Ms of reference layer 12 and saturated magnetization Ms of shift corrective layer 13 may be different from each other. For example, when saturated magnetization Ms of reference layer 12 can be made to be smaller than saturated magnetization Ms of shift corrective layer 13, convex width d of shift corrective layer 13 can further be made to be smaller than the above-mentioned simulation result.

2.-2.-4. Conclusion

As described above, according to the first embodiment, it is possible to correct the shift of the RH curve of the storage layer, even when the saturated magnetization of the reference layer is not decreased in accordance with the fineness.

In the first embodiment, concerning the vertical relationship between magnetoresistive element MTJ and the bit line, magnetoresistive element MTJ is on the downside (the semiconductor substrate side), and the bit line is on the upside, but this relationship may be reversed. Moreover, concerning the vertical relationship between the reference layer and the storage layer, the reference layer is on the upside, and the storage layer is on the downside, but this relationship may be reversed.

Moreover, in the first embodiment, the first, second and third directions are orthogonal to one another, but the directions may simply intersect with one another. When it is described that two directions intersecting with each other, the description includes a case where these two directions are orthogonal to each other.

2.-3. Second Embodiment

2.-3.-1. Structure

Figure 11:
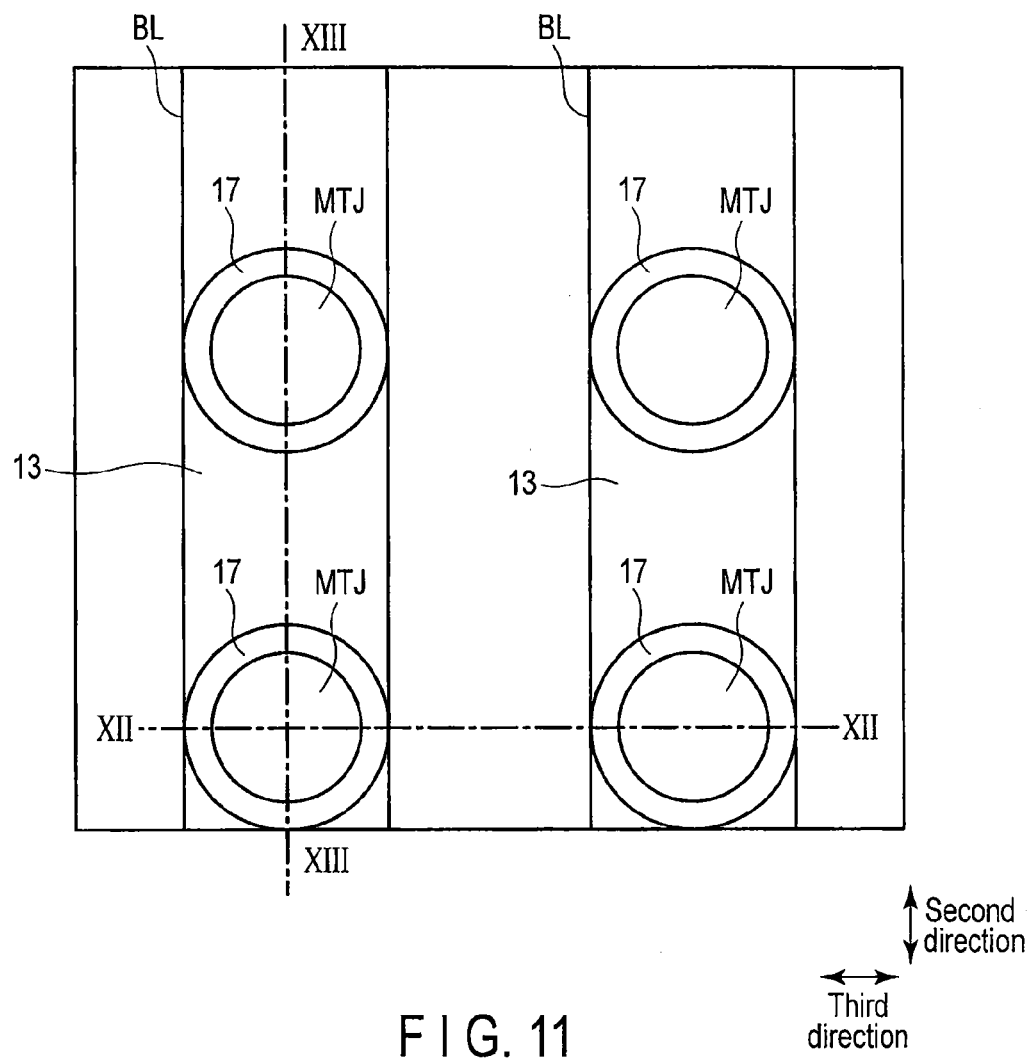
FIG. 11 is a plan view showing a second embodiment of the structure of the region X of FIG. 3.
Figure 12:
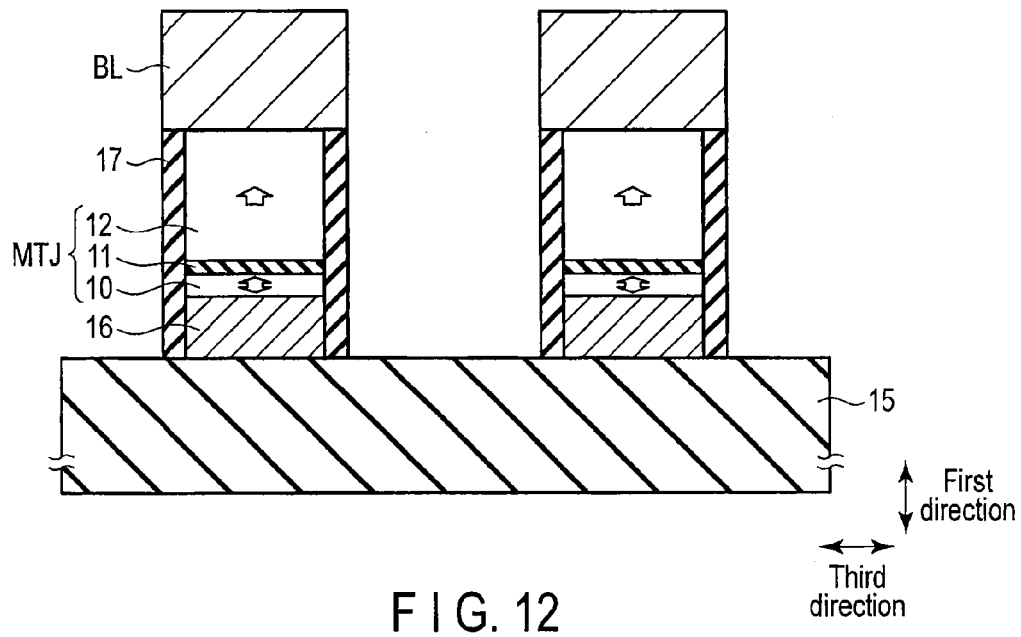
FIG. 12 is a cross-sectional view taken along the XII-XII line of FIG. 11.
Figure 13:
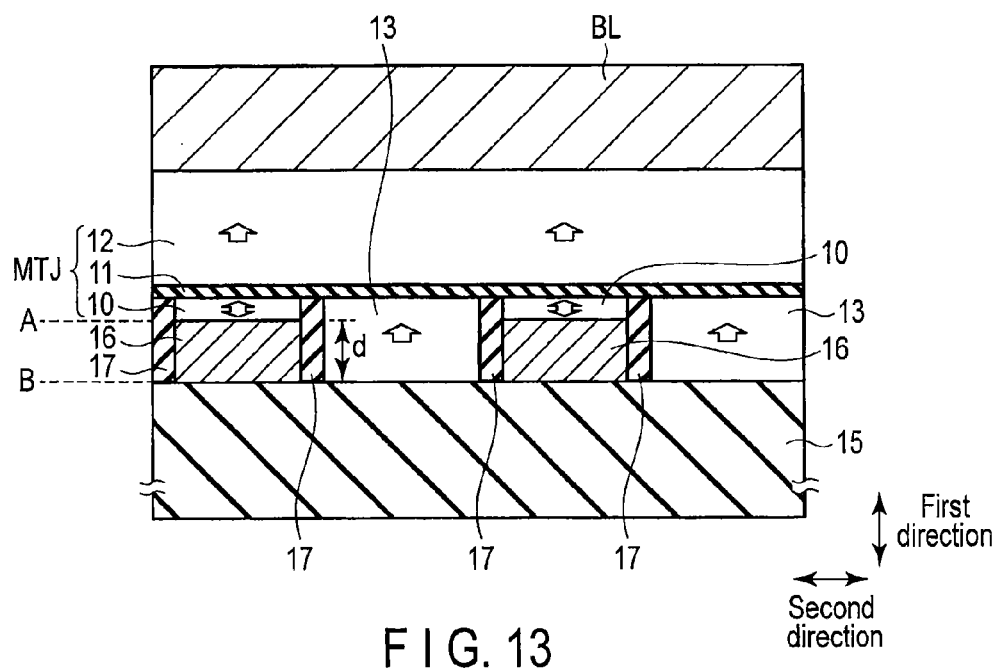
FIG. 13 is a cross-sectional view taken along the XIII-XIII line of FIG. 11.

FIG. 11 shows a structure of region X of FIG. 3. FIG. 12 is a cross-sectional view taken along the XII-XII line of FIG. 11, and FIG. 13 is a cross-sectional view taken along the XIII-XIII line of FIG. 11.

The second embodiment is a modification of the first embodiment.

As compared with the first embodiment, the second embodiment is characterized in that reference layer 12 is shared by magnetoresistive elements MTJs arranged in a second direction. In the other respects, the second embodiment is the same as the first embodiment, and hence in FIG. 11 to FIG. 13, the same elements as those of FIG. 3 to FIG. 6 are denoted with the same reference marks, and detailed description of the elements is omitted.

Reference layers 12 of magnetoresistive elements MTJs arranged in the second direction extend in the second direction in state of combining with each other. Reference layers 12 of magnetoresistive elements MTJs constitute a second conductive layer. A bit line (a first conductive layer) is stacked on reference layer 12 as the second conductive layer.

Side surfaces of storage layer 10 and lower electrode 16 are covered with protective layer 17 as an insulating layer. Shift corrective layer 13 is interposed between storage layers 10 of magnetoresistive elements MTJs arranged in the second direction. Tunnel barrier layers 11 are arranged between storage layer 10 and reference layer 12, and between reference layer 12 and shift corrective layer 13, respectively. Additionally, tunnel barrier layer 11 between reference layer 12 and shift corrective layer 13 may be omitted.

Moreover, when tunnel barrier layer 11 between reference layer 12 and shift corrective layer 13 is not present, reference layer 12 and shift corrective layer 13 may integrally be formed by the same material.

In the present embodiment, both magnetization directions of reference layer 12 and shift corrective layer 13 are upward, but this direction can be changed to a downward direction.

Similarly to the first embodiment, convex width d of shift corrective layer 13 is a width from lower surface A of storage layer 10 to a lower surface of shift corrective layer 13. A maximum value of convex width d of shift corrective layer 13 is from lower surface A of storage layer 10 to upper surface B of insulating layer 15 owing to a device structure.

In the present embodiment, a direction in which shift corrective layer 13 is disposed to storage layer 10 is the same as the second direction in which bit line BL extends. Additionally, similarly to the first embodiment, these two directions may be different from each other.

Moreover, in the present embodiment, similarly to the first embodiment, a space is formed between magnetoresistive elements MTJs, but, for example, an interlayer insulating layer is buried in this space. For the burying of the interlayer insulating layer, various methods are suggested, but the methods are not essential conditions in describing characteristics of the present embodiment, and hence the description of the burying method is omitted here.

Furthermore, a base of shift corrective layer 13 is insulating layer 15, but similarly to the first embodiment, a base electrode (e.g., the same material as in base electrode 16) may be interposed between shift corrective layer 13 and insulating layer 15 for the purpose of improvement of crystallinity of a magnetic film constituting shift corrective layer 13, or the like.

Moreover, a width of shift corrective layer 13 in a third direction is preferably about the same as or larger than a width of magnetoresistive element MTJ in the third direction.

2.-3.-2. Material Example

Material examples are the same as those of the first embodiment, and description of the examples is omitted here.

2.-3.-3. Simulation Result of Convex Width

For the convex width of the shift corrective layer, the same discussion as in the first embodiment is established, and hence the description of the convex width is omitted here.

2.-3.-4. Conclusion

As described above, according to the second embodiment, it is possible to correct shift of an RH curve of the storage layer, even when a saturated magnetization of the reference layer is not decreased in accordance with fineness. Also in the second embodiment, concerning a vertical relationship between magnetoresistive element MTJ and the bit line, both positions may be reversed.

Moreover, also in the second embodiment, the first, second and third directions are orthogonal to one another, but these directions may simply intersect with one another.

2.-4. Third Embodiment

2.-4.-1. Structure

Figure 15:
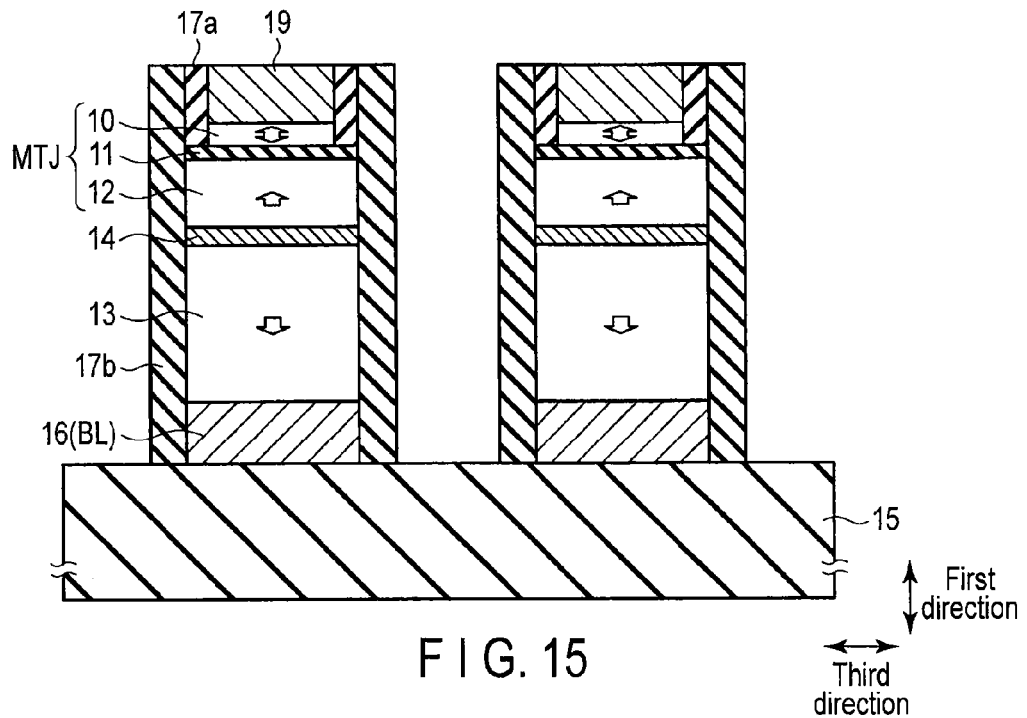
FIG. 15 is a cross-sectional view taken along the XV-XV line of FIG. 14.
Figure 16:
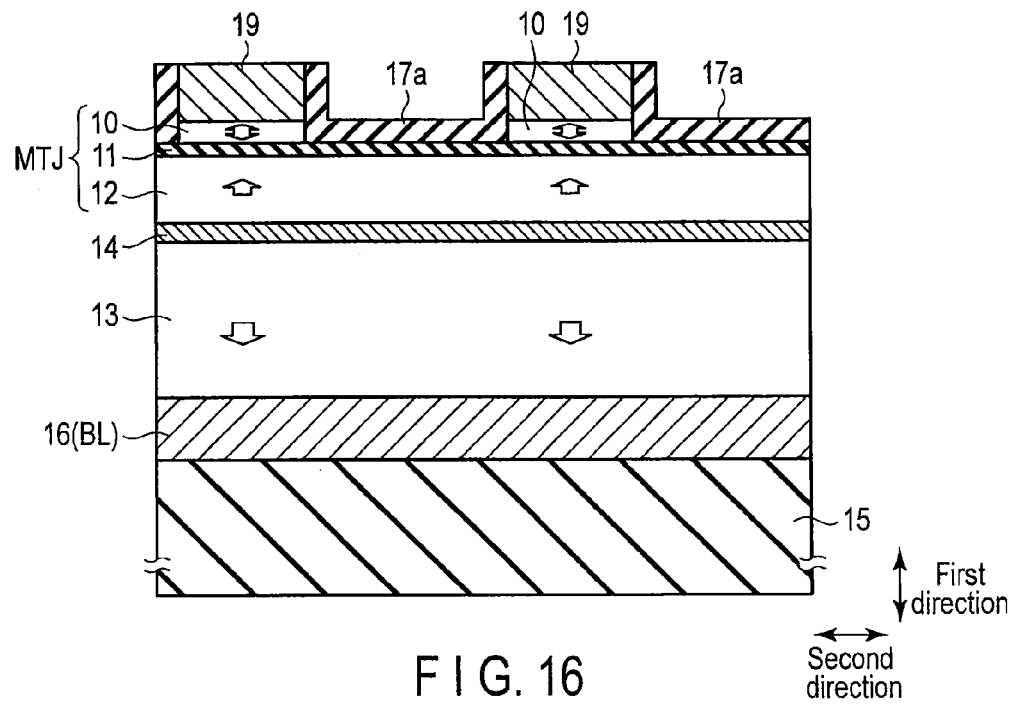
FIG. 16 is a cross-sectional view taken along the XVI-XVI line of FIG. 14.

FIG. 14 shows a structure of region X of FIG. 3. FIG. 15 is a cross-sectional view taken along the XV-XV line of FIG. 14, and FIG. 16 is a cross-sectional view taken along the XVI-XVI line of FIG. 14.

This structure is characterized in that reference layer 12 and shift corrective layer 13 are shared by magnetoresistive elements MTJs arranged in a second direction.

Insulating layer 15 is, for example, a silicon oxide layer. A selection transistor of each memory cell is disposed on, for example, a semiconductor substrate, and covered with insulating layer 15. Lower electrodes 16 are arranged on insulating layer 15. Lower electrodes 16 extend in the second direction, and serve as bit lines BLs.

Magnetoresistive elements MTJs are arranged on lower electrodes 16 as bit lines BLs, respectively.

Each of magnetoresistive elements MTJs comprises a stacked structure in which storage layer 10 with a perpendicular and variable magnetization, tunnel barrier layer 11, reference layer 12 with a perpendicular and invariable magnetization and shift corrective layer 13 with a perpendicular and invariable magnetization are arranged in this order in a first direction.

Moreover, magnetoresistive elements MTJs are arranged in an array manner in the second direction and a third direction.

Shift corrective layer 13 is disposed on lower electrodes 16, and extends in the second direction. Furthermore, reference layer 12 is disposed on shift corrective layer 13, and extends in the second direction. In the present embodiment, intermediate layer (non-magnetic layer) 14 is interposed between reference layer 12 and shift corrective layer 13. The magnetizations of reference layer 12 and shift corrective layer 13 preferably antiferromagnetically combine with each other owing to this stacked structure.

Furthermore, saturated magnetizations Ms, planar sizes, thicknesses and the like of reference layer 12 and shift corrective layer 13 are set so that a stray magnetic field from reference layer 12 and a corrective magnetic field from shift corrective layer 13 offset each other in storage layer 10.

In the present example, magnetization directions of reference layer 12 and shift corrective layer 13 need to be opposite to each other. In the present embodiment, the magnetization direction of reference layer 12 is upward, and the magnetization direction of shift corrective layer 13 is downward, but in place of these directions, the magnetization direction of reference layer 12 may be downward, and the magnetization direction of shift corrective layer 13 may be upward.

Tunnel barrier layer 11 is disposed on reference layer 12. Additionally, tunnel barrier layer 11 may be omitted from a region other than a region between storage layer 10 and reference layer 12.

Storage layer 10 is disposed on tunnel barrier layer 11, and independently disposed on each of magnetoresistive elements MTJs.

Upper electrode 19 is disposed on storage layer 10.

Side surfaces of storage layers 10 of magnetoresistive elements MTJs (the surfaces are present in the second and third directions) are covered with first protective layers 17a as insulating layers. Moreover, side surfaces of storage layer 12 and shift corrective layer 13 (the surfaces are present in the second and third directions) are covered with second protective layers 17b as insulating layers.

Each of first and second protective layers 17a and 17b may be a single layer, or comprise layers.

It is to be noted that in the present embodiment, a planar size of storage layer 10 is smaller than the planar size of reference layer 12.

In this structure, after patterning storage layers 10, side walls of the storage layers are covered with an insulating material in a manufacturing process, so that it is possible to prevent short-circuit between storage layer 10 and reference layer 12 due to a so-called re-deposition magnetic layer generated at the subsequent patterning of reference layer 12.

Additionally, the planar size of storage layer 10 can be the same as the planar size of reference layer 12. Moreover, the planar size of reference layer 12 can be smaller than the planar size of shift corrective layer 13.

In the third embodiment, since reference layer 12 and shift corrective layer 13 are shared by magnetoresistive elements MTJs arranged in the second direction, shift of an RH curve of storage layer 10 can easily be corrected, as compared with a case where reference layer 12 and shift corrective layer 13 are disposed independently for each magnetoresistive element MTJ or a case where only reference layer 12 is shared.

Therefore, the shift of the RH curve of storage layer 10 can be corrected by shift corrective layer 13, even when the saturated magnetization of the reference layer is not made to be smaller in accordance with fineness.

In the present embodiment, a space is formed between magnetoresistive elements MTJs, but, for example, an interlayer insulating layer is buried in this space. For the burying of the interlayer insulating layer, various methods are suggested, but the methods are not essential conditions in describing the characteristics of the present embodiment, and hence the description of the burying method is omitted here.

An example of the interlayer insulating layer will be illustrated in a manufacturing method described later.

2.-4.-2. Material Example

Intermediate layer 14 comprises a non-magnetic metal such as Ru or Ir. First and second protective layers 17a and 17b comprise an insulating material such as $SiO_2$, Si—N, SiON, Al—O or MgO. Lower electrode 16 and upper electrode 19 comprise a metal or a conductive material such as Ta, W, Nb, Mo, Ti, TiN, WN, Cu or CuN.

In the other respects, the present embodiment is the same as the first embodiment, and hence description of the respects is omitted here.

2.-4.-3. Simulation Result of Stacked Structure of Shift Corrective Layer and Reference Layer Next, there will be verified the effect that when the structure of the third embodiment is employed, the stray magnetic field from the reference layer is canceled by the corrective magnetic field from the shift corrective layer, in the storage layer.

A device model as an object of this simulation will be described.

FIG. 17 shows the device model.

In the drawing, the same elements as those of FIG. 14 to FIG. 16 are denoted with the same reference marks.

A memory cell array region is a square of 20 μm×20 μm, and in this memory cell array region, magnetoresistive elements MTJs are regularly arranged at a pitch of (2×W) nm in the second direction and a pitch of (2×W) nm in the third direction.

A planar shape of magnetoresistive element MTJ is a square of W nm×W nm. In this case, a space between two magnetoresistive elements MTJs in the second direction is W nm, and a space between two magnetoresistive elements MTJs in the third direction is W nm.

Thicknesses of storage layer 10, tunnel barrier layer 11 and reference layer 12 of magnetoresistive element MTJ are 2 nm, 1 nm, and t nm, respectively. Thicknesses of shift corrective layer 13 and intermediate layer 14 are 15 nm and 1 nm, respectively.

Moreover, each of storage layer 10, reference layer 12 and shift corrective layer 13 has the perpendicular magnetization, the magnetization direction of reference layer 12 is upward, and the magnetization direction of shift corrective layer 13 is downward.

It is to be noted that the drawing only shows only four magnetoresistive elements (2×2) MTJs, but such magnetoresistive elements MTJs are laid all over the memory cell array region.

On the basis of such a model, a strength of the stray magnetic field in storage layer 10 is calculated. Additionally, the strength of the stray magnetic field in storage layer 10 is calculated in an orthogonal coordinate system in which the center of storage layer 10 is an origin, the first direction (the perpendicular direction) is a z-axis, the second direction is a y-axis, and the third direction is an x-axis.

Figure 18:
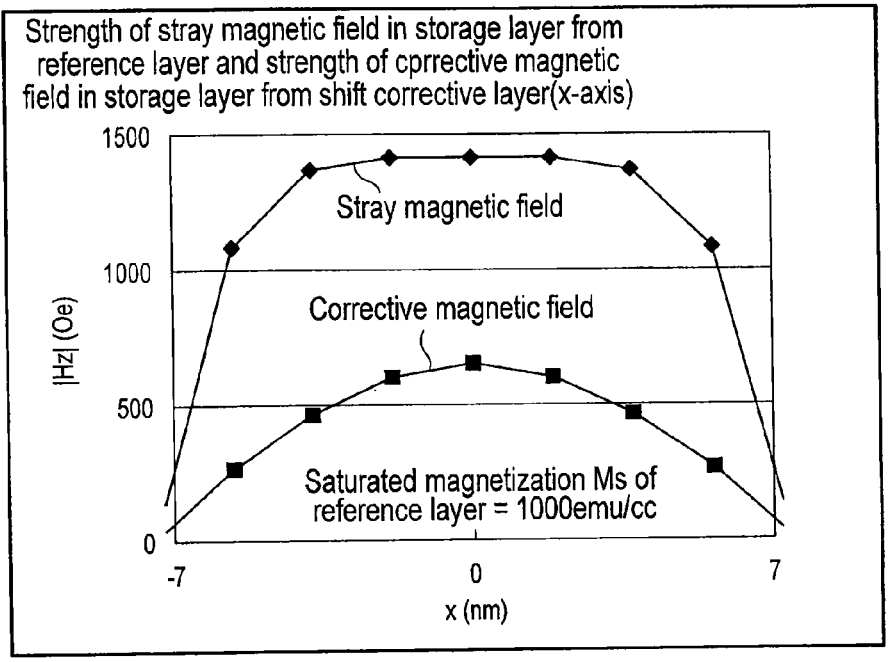
FIG. 18 is a diagram showing strengths of a stray magnetic field and a corrective magnetic field.

FIG. 18 shows the strength of the stray magnetic field and the strength of the corrective magnetic field in the storage layer.

The drawing illustrates a magnetic field strength (a z-component) on the x-axis in storage layer 10, concerning the stray magnetic field from reference layer 12 and corrective magnetic field from shift corrective layer 13. Size W of magnetoresistive element MTJ is 15 nm, and thickness t of reference layer 12 is 5 nm.

Moreover, both saturated magnetizations Ms of reference layer 12 and shift corrective layer 13 are Ms=1000 emu/cc.

A polarity of the stray magnetic field from reference layer 12 and a polarity of the corrective magnetic field from shift corrective layer 13 are reverse to each other, and hence the ordinate of the drawing indicates an absolute value of the magnetic field strength.

It is seen from the drawing that in the above-mentioned device model, when saturated magnetizations Ms of reference layer 12 and shift corrective layer 13 are the same, the strength of the corrective magnetic field from shift corrective layer 13 is about 40% of the strength of the stray magnetic field from reference layer 12. That is, in storage layer 10, an average value of the strength of the stray magnetic field from reference layer 12 is about 1000 [Oe], whereas an average value of the strength of the corrective magnetic field from shift corrective layer 13 is about 400 [Oe].

Therefore, it is seen that in this device model, to cancel the stray magnetic field in storage layer 10, saturated magnetization Ms of reference layer 12 may be about 40% of saturated magnetization Ms of shift corrective layer 13.

Figure 19:
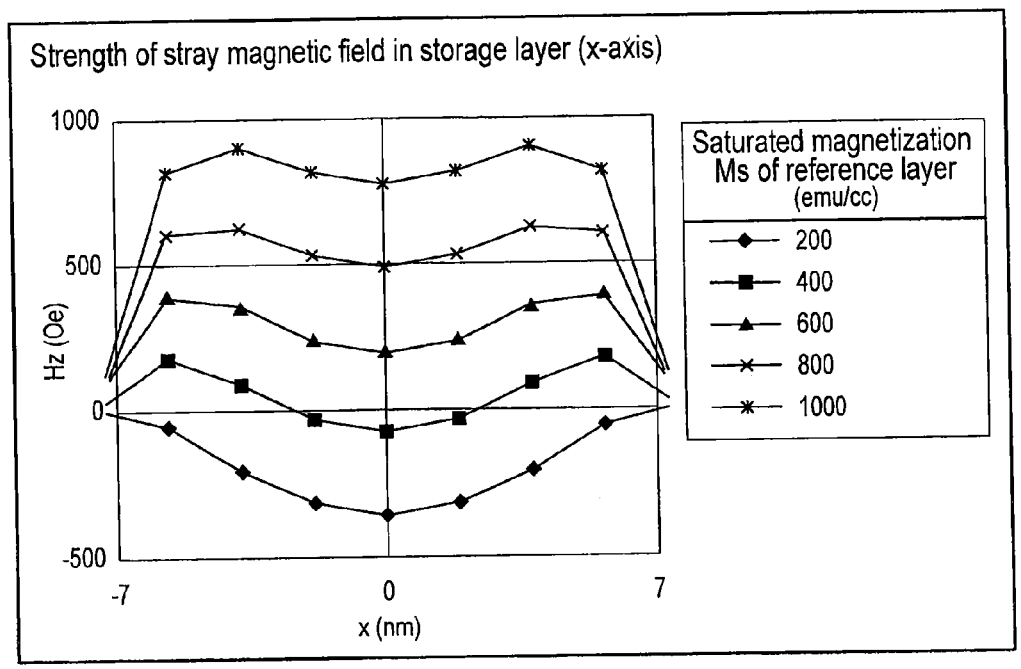
FIG. 19 is a diagram showing the strength of the stray magnetic field in the storage layer.

FIG. 19 shows a calculation result of the strength of the stray magnetic field in the storage layer.

The strength of the stray magnetic field here means a value obtained by subtracting the strength of the corrective magnetic field from shift corrective layer 13 from the strength of the stray magnetic field from reference layer 12, in storage layer 10.

The drawing shows the magnetic field strength (the z-component) on the x-axis in storage layer 10, concerning the stray magnetic field from reference layer 12. Size W of magnetoresistive element MTJ is 15 nm, and thickness t of reference layer 12 is 5 nm.

Moreover, saturated magnetization Ms of shift corrective layer 13 is Ms=1000 emu/cc, and saturated magnetization Ms of reference layer 12 is used as a parameter.

It is seen from the drawing that when saturated magnetization Ms of reference layer 12 is in excess of 40% of saturated magnetization Ms of shift corrective layer 13, i.e., when saturated magnetization Ms of reference layer 12 is 600 emu/cc, 800 emu/cc, and 1000 emu/cc, an average value of the strength (upward) of the stray magnetic field in storage layer 10 is noticeably above zero, and the device model is not a preferable magnetic memory.

Moreover, when saturated magnetization Ms of reference layer 12 is below 40% of saturated magnetization Ms of shift corrective layer 13, i.e., when saturated magnetization Ms of reference layer 12 is 200 emu/cc, the average value of the strength (downward) of the stray magnetic field, in storage layer 10 is noticeably below zero, and this device model is not a preferable magnetic memory, either.

On the other hand, when saturated magnetization Ms of reference layer 12 is about 40% of saturated magnetization Ms of shift corrective layer 13, i.e., when saturated magnetization Ms of reference layer 12 is 400 emu/cc, the average value of the strength of the stray magnetic field in storage layer 10 is substantially zero, and hence the device model can be operated as the magnetic memory.

Thus, in the above-mentioned device model, when saturated magnetization Ms of reference layer 12 is about 40% of saturated magnetization Ms of shift corrective layer 13 and saturated magnetization Ms of shift corrective layer 13 is, for example, 1000 emu/cc, saturated magnetization Ms of reference layer 12 is set to about 400 emu/cc, for example, a value in a range of 350 to 450 emu/cc, so that the shift of the RH curve of storage layer 10 can be corrected.

Additionally, it is easily presumed that in a reference example such as a case where reference layer 12 and shift corrective layer 13 are disposed independently for each magnetoresistive element MTJ or a case where only reference layer 12 is shared, the RH curve cannot be corrected, when saturated magnetization Ms of reference layer 12 is not set to a value sufficiently smaller than 40% of saturated magnetization Ms of shift corrective layer 13.

However, as described above, when saturated magnetization Ms of reference layer 12 is excessively decreased, perpendicular magnetic anisotropy decreases, and hence the layer cannot serve as a perpendicularly magnetized film. As a result, saturated magnetization Ms of reference layer 12 cannot excessively be decreased.

According to the structure of the third embodiment, reference layer 12 and shift corrective layer 13 are integrally formed in the second direction (the direction in which the bit line extends). Therefore, even when saturated magnetization Ms of reference layer 12 is not decreased in accordance with fineness (the magnetization is about 40% of the saturated magnetization of shift corrective layer 13), the shift of the RH curve of storage layer 10 can be corrected by the corrective magnetic field from shift corrective layer 13.

It is to be noted that the planar size of storage layer 10 and the planar size of reference layer 12 may be different from each other. For example, when the planar size of storage layer 10 can be smaller than the planar size of each of reference layer 12 and shift corrective layer 13, the corrective magnetic field from shift corrective layer 13 can further effectively be applied to storage layer 10, and hence saturated magnetization Ms of reference layer 12 can be increased.

Hereinafter, this effect will be described.

Figure 20:
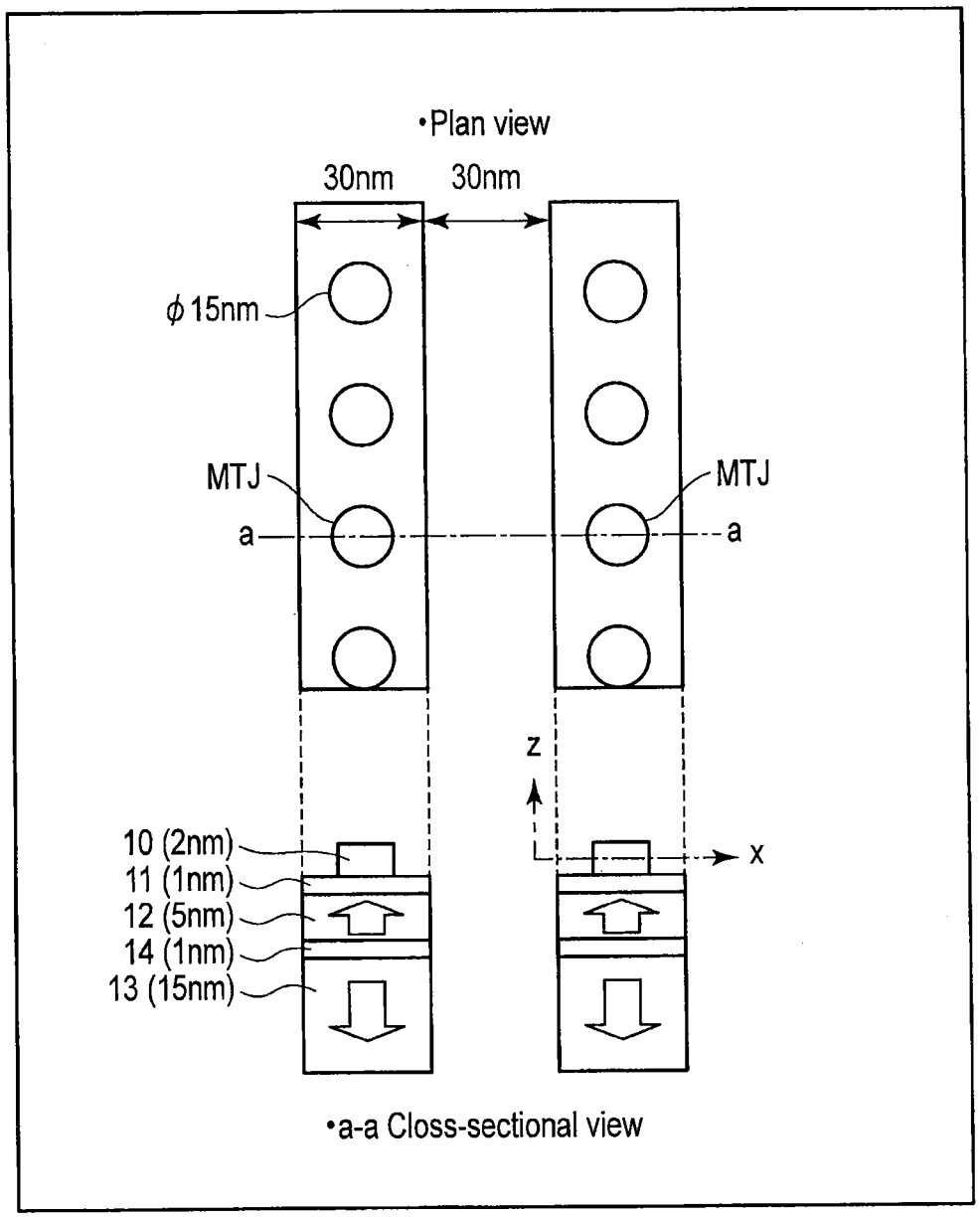
FIG. 20 is a view showing a simulation model.

FIG. 20 shows a device model.

In the drawing, the same elements as those of FIG. 14 to FIG. 16 are denoted with the same reference marks.

This device model is different from the device model of FIG. 17 in that a planar size of magnetoresistive element MTJ is a diameter of 15 nm of a round shape, and a third-direction width (line)/space of each of reference layer 12 and shift corrective layer 13 extending in a second direction is 30 nm/30 nm.

That is, when the planar size of magnetoresistive element MTJ is F (=15 nm), a line&space pitch of reference layer 12 and shift corrective layer 13 is 4F.

Moreover, thickness t of reference layer 12 is 5 nm.

On the basis of such a model, the strength of the stray magnetic field in storage layer 10 is calculated. Additionally, the strength of the stray magnetic field in storage layer 10 is calculated in an orthogonal coordinate system in which a first direction (a perpendicular direction) is a z-axis, a second direction is a y-axis, and a line passing through the center of storage layer 10 and extending in a third direction is an x-axis.

Figure 21:
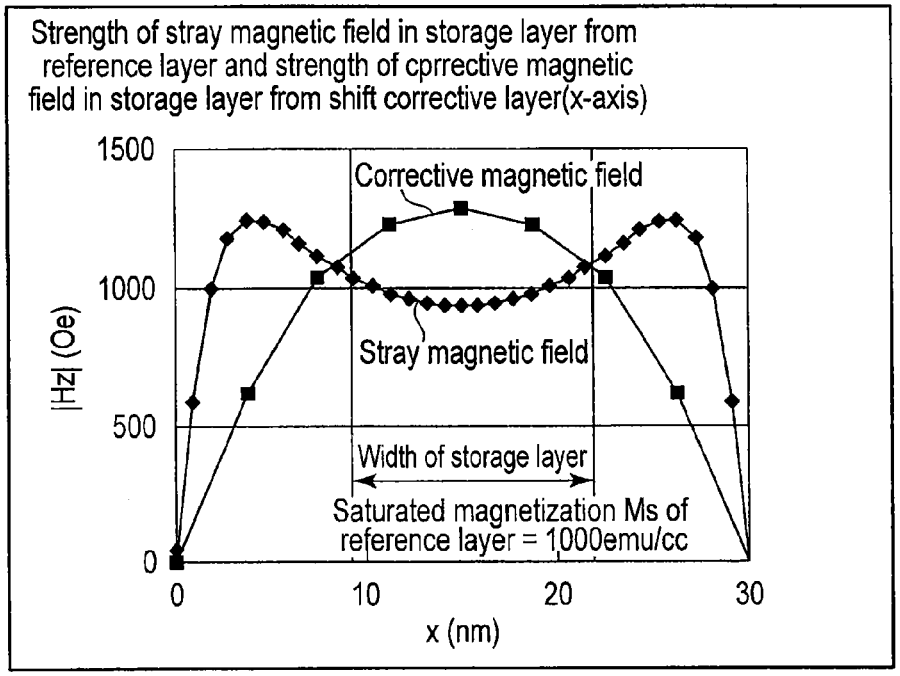
FIG. 21 is a diagram showing the strengths of the stray magnetic field and the corrective magnetic field.

FIG. 21 shows the strengths of the stray magnetic field and the corrective magnetic field in the storage layer.

The drawing illustrates a magnetic field strength (a z-component) on the x-axis in storage layer 10, concerning the stray magnetic field from reference layer 12 and the corrective magnetic field from shift corrective layer 13. Storage layer 10 of magnetoresistive element MTJ is in a range of 10 nm≤x≤20 nm.

Furthermore, both saturated magnetizations Ms of reference layer 12 and shift corrective layer 13 are Ms=1000 emu/cc.

A polarity of the stray magnetic field from reference layer 12 and a polarity of the corrective magnetic field from shift corrective layer 13 are reverse to each other, and hence the ordinate of the drawing indicates an absolute value of the magnetic field strength.

It is seen from the drawing that in the above-mentioned device model, even when saturated magnetizations Ms of reference layer 12 and shift corrective layer 13 are the same, the planar size of storage layer 10 is decreased, to increase the strength of the corrective magnetic field in storage layer 10.

In the drawing, as compared with FIG. 18, the strength of the corrective magnetic field in storage layer 10 increases as much as twice or more times. On the other hand, the strength of the stray magnetic field in storage layer 10 hardly changes.

As a result, in storage layer 10, the strength of the corrective magnetic field from shift corrective layer 13 is about the same as the strength of the stray magnetic field from reference layer 12. That is, storage layer 10, an average value of the strength of the stray magnetic field from reference layer 12 is about 1000 [Oe], and an average value of the strength of the corrective magnetic field from shift corrective layer 13 is also about 1000 [Oe].

Therefore, it is seen that in this device model, to cancel the stray magnetic field in storage layer 10, saturated magnetization Ms of reference layer 12 may be set to be the same or about the same as saturated magnetization Ms of shift corrective layer 13.

Figure 22:
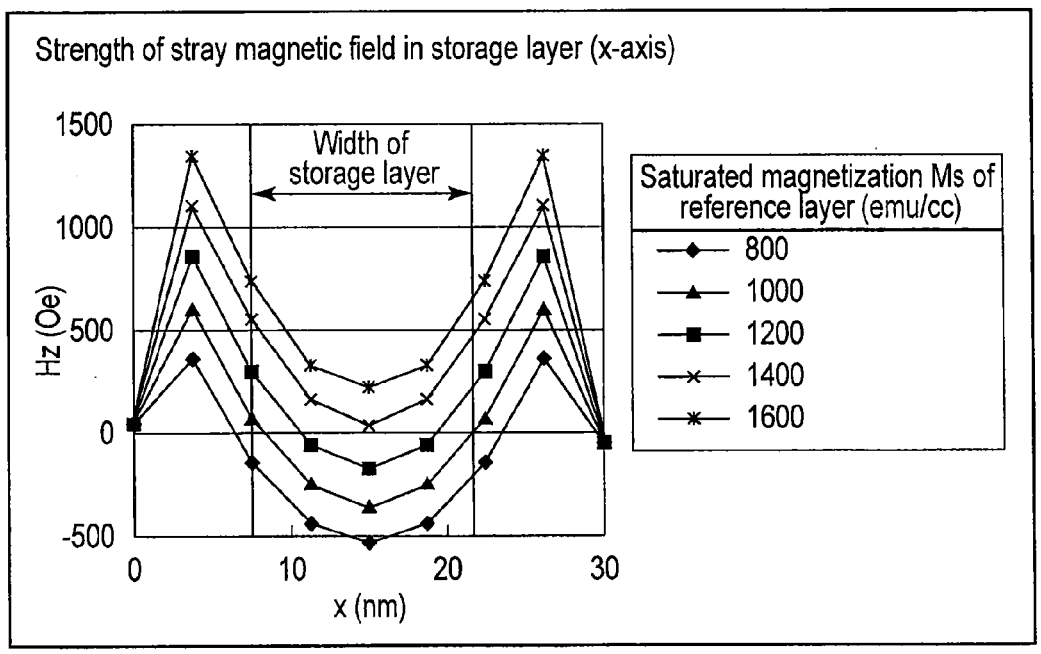
FIG. 22 is a diagram showing the strength of the stray magnetic field in the storage layer.

FIG. 22 shows a calculation result of the strength of the stray magnetic field in the storage layer.

The strength of the stray magnetic field here means a value obtained by subtracting the strength of the corrective magnetic field from shift corrective layer 13 from the strength of the stray magnetic field from reference layer 12, in storage layer 10.

The drawing illustrates a magnetic field strength (a z-component) on the x-axis in storage layer 10, concerning the stray magnetic field from reference layer 12.

Moreover, saturated magnetization Ms of shift corrective layer 13 is Ms=1000 emu/cc, and saturated magnetization Ms of reference layer 12 is used as a parameter.

It is seen from the drawing that when saturated magnetization Ms of reference layer 12 is noticeably in excess of saturated magnetization Ms of shift corrective layer 13, i.e., when saturated magnetization Ms of reference layer 12 is 1400 emu/cc and 1600 emu/cc, an average value of the strength (upward) of the stray magnetic field in storage layer 10 is noticeably above zero, and the device model is not a preferable magnetic memory.

Furthermore, when saturated magnetization Ms of reference layer 12 is below saturated magnetization Ms of shift corrective layer 13, i.e., when saturated magnetization Ms of reference layer 12 is 800 emu/cc, the average value of the strength (downward) of the stray magnetic field in storage layer 10 is noticeably below zero, and this device model is not a preferable magnetic memory, either.

On the other hand, when saturated magnetization Ms of reference layer 12 is about the same as saturated magnetization Ms of shift corrective layer 13, i.e., when saturated magnetization Ms of reference layer 12 is from 1000 emu/cc to 1200 emu/cc, the average value of the strength of the stray magnetic field in storage layer 10 is substantially zero, and hence the device model can be operated as the magnetic memory.

Thus, in the above-mentioned device model, when saturated magnetization Ms of reference layer 12 is about the same as saturated magnetization Ms of shift corrective layer 13 and saturated magnetization Ms of shift corrective layer 13 is, for example, 1000 emu/cc, saturated magnetization Ms of reference layer 12 is also set to a value of about 1000 emu/cc to 1200 emu/cc, so that the shift of the RH curve of storage layer 10 can be corrected.

It is to be noted that as described above, when the planar size of storage layer 10 is the same as the planar size of reference layer 12, the RH curve cannot be corrected, if saturated magnetization Ms of reference layer 12 is not set to be about 40% of saturated magnetization Ms of shift corrective layer 13.

That is, when the planar size of storage layer 10 which is smaller than the planar size of each of reference layer 12 and shift corrective layer 13, the shift of the RH curve of storage layer 10 can be corrected by the corrective magnetic field from shift corrective layer 13, even if saturated magnetization Ms of reference layer 12 is the same or about the same as the saturated magnetization of shift corrective layer 13.

Next, there will be verified a maximum value of an absolute value of the magnetic field strength (the z-component) made on the x-axis in storage layer 10 by the stray magnetic field from reference layer 12, and a maximum value of an absolute value of the magnetic field strength (the z-component) made on the x-axis in storage layer 10 by the corrective magnetic field from shift corrective layer 13, respectively, for a case where the width of the reference layer and the thickness of the reference layer in the device model shown in FIG. 20 are changed.

Figure 23:
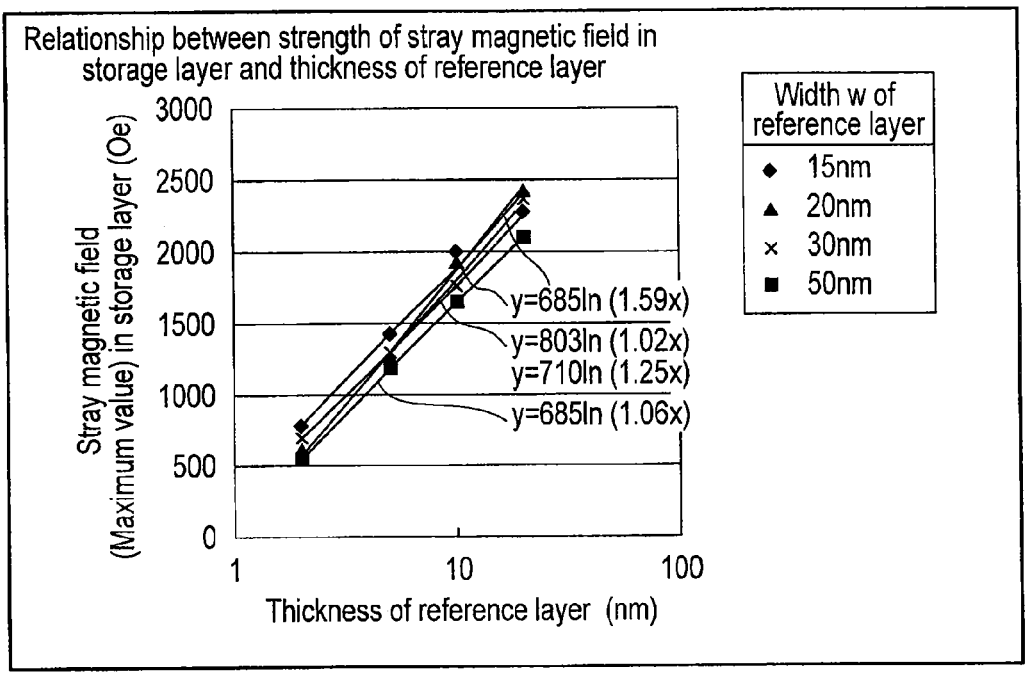
FIG. 23 is a diagram showing a relationship between the stray magnetic field and a thickness of a reference layer.

FIG. 23 shows the maximum value of the absolute value of the magnetic field strength (the z-component) made on the x-axis in the storage layer by the stray magnetic field from the reference layer.

Here, the abscissa (x) indicates the thickness of reference layer 12, and the ordinate (y) indicates the stray magnetic field (the maximum value) in storage layer 10. Then, width W of reference layer 12 (=the width of shift corrective layer 13) is used as the parameter, and a relationship between the strength of the stray magnetic field in storage layer 10 and the thickness of reference layer 12 is represented by an equation.

Figure 24:
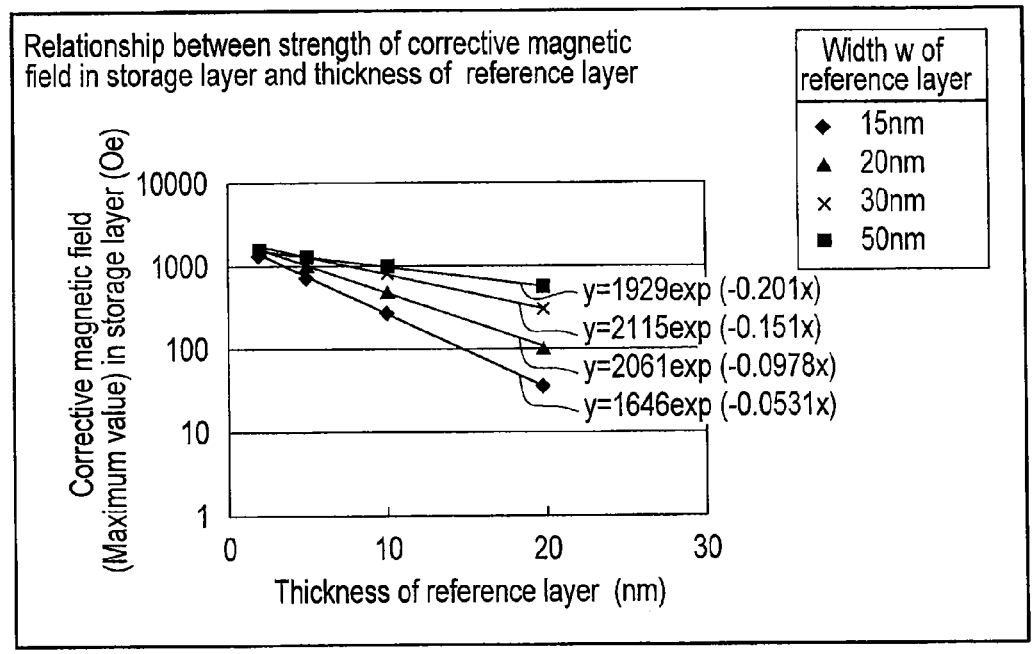
FIG. 24 is a diagram showing a relationship between the corrective magnetic field and the thickness of the reference layer.

FIG. 24 shows the maximum value of the absolute value of the magnetic field strength (the z-component) made on the x-axis in the storage layer by the corrective magnetic field from the shift corrective layer.

Here, the abscissa (x) indicates the thickness of reference layer 12, and the ordinate (y) indicates the corrective magnetic field (the maximum value) in storage layer 10. Then, width W of reference layer 12 (=the width of shift corrective layer 13) is used as the parameter, and a relationship between the strength of the corrective magnetic field in storage layer 10 and the thickness of reference layer 12 is represented by an equation.

Additionally, in FIG. 23 and FIG. 24, saturated magnetization Ms of each of reference layer 12 and shift corrective layer 13 is 1000 emu/cc, and the thickness of shift corrective layer 13 is 15 nm.

First, as shown in FIG. 23, the magnetic field made by the magnetization of reference layer 12 is a straight line, when the abscissa (the thickness of reference layer 12) indicates logarithms. That is, the maximum value of the stray magnetic field in storage layer 10 logarithmically increases in accordance with the thickness of the reference layer. It is to be noted that for each width W of reference layer 12, a fitting function concerning the relationship between the strength of the stray magnetic field and the thickness of the reference layer is shown in the drawing.

Moreover, as shown in FIG. 24, the magnetic field made by the magnetization of shift corrective layer 13 is a straight line, when the ordinate indicates logarithms. That is, the maximum value of the corrective magnetic field in storage layer 10 exponentially decreases in accordance with the thickness of the reference layer. It is to be noted that for each width W of reference layer 12, a fitting function concerning the relationship between the strength of the corrective magnetic field and the thickness of the reference layer is shown in the drawing.

Furthermore, saturated magnetization Ms of reference layer 12 required for the shift correction of the RH curve is obtained by use of the fitting functions of FIG. 23 and FIG. 24.

FIG. 25 shows saturated magnetization Ms of reference layer 12 required for the shift correction of the RH curve, on the basis of the fitting functions.

Saturated magnetization Ms-ref of reference layer 12 required for the shift correction of the RH curve is approximated by:

$$Ms\text{-}ref = (|H\text{max-shift}|/|H\text{max-ref}|) \times Ms\text{-shift},$$

in which Hmax-ref is the maximum value of the magnetic field made in storage layer 10 by reference layer 12, Hmax-shift is the maximum value of the magnetic field made in storage layer 10 by shift corrective layer 13, and Ms-shift is the saturated magnetization of shift corrective layer 13. Saturated magnetization Ms-shift of shift corrective layer 13 is 1000 emu/cc.

Hmax-ref and Hmax-shift are represented by the fitting functions shown in FIG. 23 and FIG. 24, respectively.

It is seen from the drawing that when width W of reference layer 12 (=the width of shift corrective layer 13) is larger than the width (15 nm) of storage layer 10, the saturated magnetization Ms-ref required for reference layer 12 can be increased.

Moreover, when the thickness of reference layer 12 is smaller than the thickness (15 nm) of shift corrective layer 13, the saturated magnetization Ms-ref required for reference layer 12 can be increased.

The saturated magnetization Ms-ref of reference layer 12 obtained as described above requires several corrections. This is because the magnetic field made by reference layer 12 and the magnetic field made by the shift corrective layer are different from each other in distribution (configuration) of the magnetic field strength, it is therefore necessary to compare average values obtained from the respective magnetic fields, and at the comparison, several errors are generated.

It is to be noted that the magnetization directions of reference layer 12 and shift corrective layer 13 are always fixed to the predetermined directions, and hence reference layer 12 and shift corrective layer 13 require very large thermostable energy. In general, the thermostable energy of the magnetization is proportional to a volume of a magnetic material in a range of an activated volume.

That is, in the device model of FIG. 20, the thicknesses of reference layer 12 and shift corrective layer 13 are comparatively increased, to increase the volumes of the layers, which enables the increase of the thermostable energy (the perpendicular magnetic anisotropic energy). Therefore, restrictions on saturated magnetizations Ms of reference layer 12 and shift corrective layer 13 which are required for the device model of FIG. 20 are alleviated, and consequently, there is an extensive choice of the materials of the layers.

2.-4.-4. Others

The third embodiment is characterized in that reference layer 12 and shift corrective layer 13 are shared by magnetoresistive elements MTJs arranged in the second direction.

On the other hand, as a comparative example, a technology is known in which only reference layer 12 is shared by magnetoresistive elements MTJs arranged in the second direction. However, in this technology, as apparent from FIG. 21, the average value of the strength of the stray magnetic field from reference layer 12 is about 1000 [Oe] in storage layer 10.

That is, when only reference layer 12 is shared by magnetoresistive elements MTJs arranged in the second direction, the shift of the RH curve of storage layer 10 cannot be corrected.

In consequence, the technology of sharing shift corrective layer 13 by magnetoresistive elements MTJs arranged in the second direction becomes effective as in the third embodiment.

2.-4.-5. Conclusion

As described above, according to the third embodiment, it is possible to correct the shift of the RH curve of the storage layer, even when the saturated magnetization of the reference layer is not decreased in accordance with the fineness. Also in the third embodiment, concerning the vertical relationship between magnetoresistive element MTJ and the bit line, both positions may be reversed.

Moreover, also in the third embodiment, the first, second and third directions are orthogonal to one another, but these directions may simply intersect with one another.

3. MANUFACTURING METHOD

The device structures according to the above-mentioned first to third embodiments can easily be manufactured by employing a usual magnetic memory manufacturing method.

The manufacturing method of the structure according to the first embodiment will be described.

First, as shown in FIG. 26, selection transistors STs are formed on semiconductor substrate 31. Each selection transistor ST has source/drain diffusion layer 32 and gate electrode (word line) WL. Selection transistor ST can easily be formed by combining a usual conductive layer deposition method, a lithography method, an ion implantation method and the like.

Moreover, insulating layer 33 which covers selection transistors STs is formed, and in insulating layer 33, contact plug 34 is formed to reach source/drain diffusion layer 32.

Afterward, lower electrode (e.g., a stacked layer of Ta: 5 nm and Ru: 10 nm) 16 as a base layer which comes in contact with contact plug 34 is formed on insulating layer 33 by use of a sputtering method, an MBE method or the like.

Moreover, storage layer (e.g., CoFeB: 2 nm) 10, tunnel barrier layer (e.g., MgO: 1 nm) 11 and reference layer (e.g., a stacked layer of CoFeB: 1 nm and FePt: 10 nm) 12 are successively formed on lower electrode 16 by use of the sputtering method, the MBE method or the like.

Continuously, upper electrode (e.g., a stacked layer of Ta: 80 nm and Ru: 10 nm) 19A and hard mask layer (e.g., $SiO_2$: 100 nm) 19B are formed on reference layer 12 by use of the sputtering method. Here, upper electrode 19A serves as the cap layer of the magnetoresistive element and the hard mask layer.

Next, as shown in FIG. 27, a resist pattern (e.g., a width of 30 nm) 35 is formed on hard mask layer 19B by use of a stepper.

Moreover, when hard mask layer 19B is patterned by RIE using a $CHF_3$ gas by use of resist pattern 35 as a mask, as shown in FIG. 28, resist pattern 35 is transferred to hard mask layer 19B.

Afterward, when resist pattern 35 is removed by $O_2$ ashing, a structure shown in FIG. 29 is obtained.

Next, as shown in FIG. 30, upper electrode 19A is patterned by RIE using a $Cl_2$ gas by use of hard mask layer 19B as the mask.

Next, as shown in FIG. 31, reference layer 12, tunnel barrier layer 11, storage layer 10 and lower electrode 16 are successively etched by ion milling of Ar ions by use of upper electrode (hard mask layer) 19A as the mask. As a result, for example, magnetoresistive element MTJ of 30 nm×30 nm size is formed.

Next, as shown in FIG. 32, protective layer (e.g., Si—N: 10 nm) 17 which covers magnetoresistive element MTJ is formed by using ALD.

Figure 33:
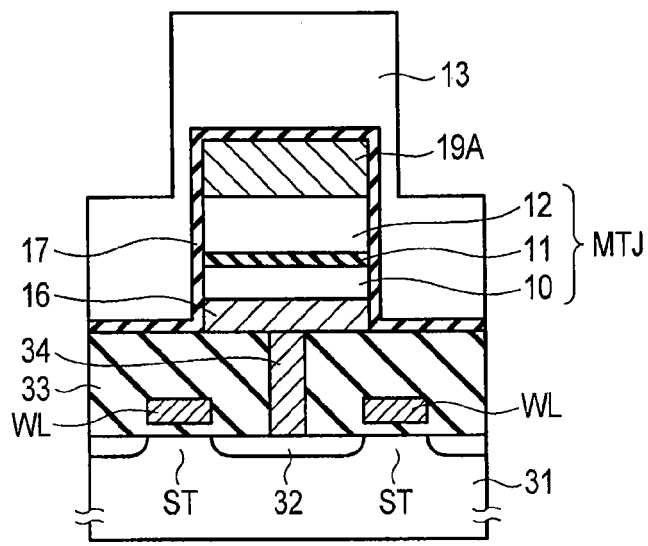

Next, as shown in FIG. 33, shift corrective layer (e.g., FePt: 20 nm) 13 is formed on protective layer 17 by use of the sputtering method.

Figure 34:
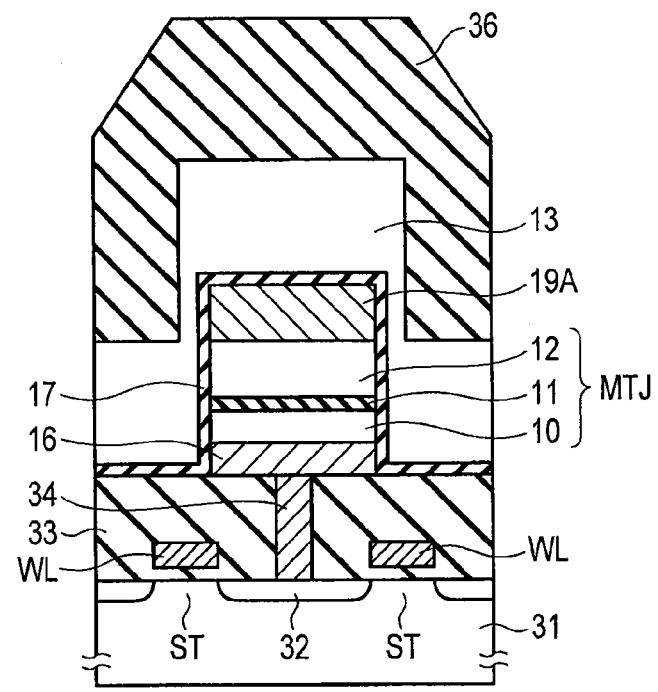

Next, as shown in FIG. 34, interlayer insulating layer (e.g., $SiO_2$: 300 nm) 36 is formed on shift corrective layer 13 by use of a CVD method.

Next, as shown in FIG. 35, a flattening treatment is performed by using a chemical mechanical polishing (CMP) method, until upper electrode 19A of magnetoresistive element MTJ is exposed.

Finally, as shown in FIG. 36, bit line (e.g., a stacked layer of Ti: 20 nm, Al: 200 nm and Ti: 10 nm) BL which comes in contact with upper electrode 19A is formed on interlayer insulating layer 36. Here, bit line BL may come in contact with shift corrective layer 13, or may not come in contact with shift corrective layer 13. In the forming step of bit line BL, a portion other than the shift corrective layer right under bit line BL is removed by the etching.

By the above steps, the device structure according to the first embodiment is manufactured.

It is to be noted that in the illustrations of FIG. 26 to FIG. 36, a size of magnetoresistive element MTJ is larger than a size of contact plug 34, but the sizes are not limited to this drawing. For example, the size of magnetoresistive element MTJ may be equal to or smaller than the size of contact plug 34.

Additionally, each of the sizes of magnetoresistive element MTJ and contact plug 34 means a size (a planar size) parallel to the surface of semiconductor substrate 31.

The manufacturing method of the structure according to the third embodiment will be described.

First, as shown in FIG. 37, selection transistors STs are formed on semiconductor substrate 31. Each selection transistor ST has source/drain diffusion layer 32 and gate electrode (word line) WL. Selection transistor ST can easily be formed by combining a usual conductive layer deposition method, a lithography method, an ion implantation method and the like.

Moreover, insulating layer 33 which covers selection transistors STs is formed, and in insulating layer 33, contact plug 34 is formed to reach source/drain diffusion layer 32.

Afterward, lower electrode (e.g., a stacked layer of Ta: 5 nm and Ru: 10 nm) 16 as a base layer is formed on insulating layer 33 by use of a sputtering method, an MBE method or the like.

In the present example, this lower electrode 16 serves as, for example, bit line BL.

Moreover, shift corrective layer (e.g., FePt: 20 nm) 13 is formed on lower electrode 16 by use of the sputtering method. Continuously, intermediate layer (a non-magnetic metal such as Ru or Ir) 14 is formed on shift corrective layer 13 by use of the sputtering method.

Afterward, reference layer (e.g., a stacked layer of CoFeB: 1 nm and FePt: 10 nm) 12, tunnel barrier layer (e.g., MgO: 1 nm) 11 and storage layer (e.g., CoFeB: 2 nm) 10 are then successively formed by use of the sputtering method, the MBE method or the like.

Continuously, upper electrode (e.g., a stacked layer of Ta: 80 nm and Ru: 10 nm) 19A and hard mask layer (e.g., $SiO_2$: 100 nm) 19B are formed on storage layer 10 by use of the sputtering method. Here, upper electrode 19A serves as the cap layer of the magnetoresistive element and the hard mask layer.

Next, as shown in FIG. 38, a resist pattern (e.g., a width of 30 nm) 35 is formed on hard mask layer 19B by use of a stepper.

Moreover, when hard mask layer 19B is patterned by RIE using a $CHF_3$ gas by use of resist pattern 35 as a mask, as shown in FIG. 39, resist pattern 35 is transferred to hard mask layer 19B.

Afterward, when resist pattern 35 is removed by $O_2$ ashing, a structure shown in FIG. 40 is obtained.

Next, as shown in FIG. 41, upper electrode 19A and storage layer 10 are patterned by RIE using a $Cl_2$ gas by use of hard mask layer 19B as the mask. At this time, most or all of hard mask layer 19B is removed.

In this patterning, the etching to storage layer 10 is performed, and the etching of reference layer 12 is not performed. That is, the etching is stopped at tunnel barrier layer 11.

Next, as shown in FIG. 42, first protective layer (side wall spacer insulating layer) 17*a* is formed on side walls of storage layer 10 and upper electrode 19A.

Figure 43:
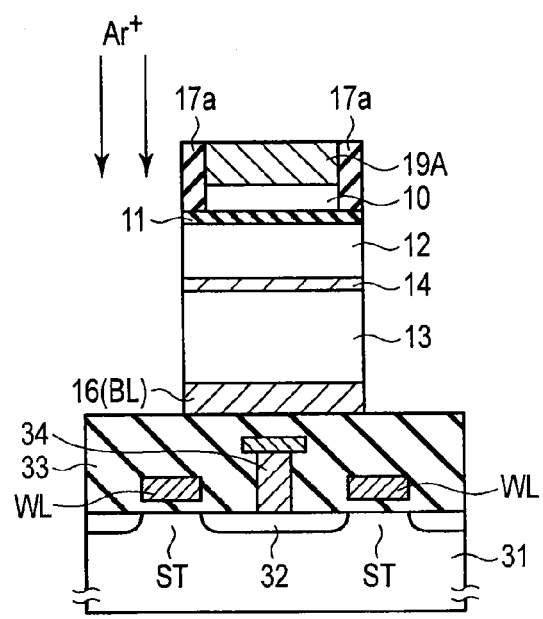

Then, reference layer 12, intermediate layer 14, shift corrective layer 13 and lower electrode 16 are successively etched by ion milling of Ar ions by use of upper electrode (hard mask layer) 19A and first protective layer (side wall spacer layer) 17*a* as the masks, to obtain a structure shown in FIG. 43.

As a result, for example, magnetoresistive element MTJ is formed in which a size of storage layer 10 and a size of reference layer 12 are different from each other.

Figure 44:
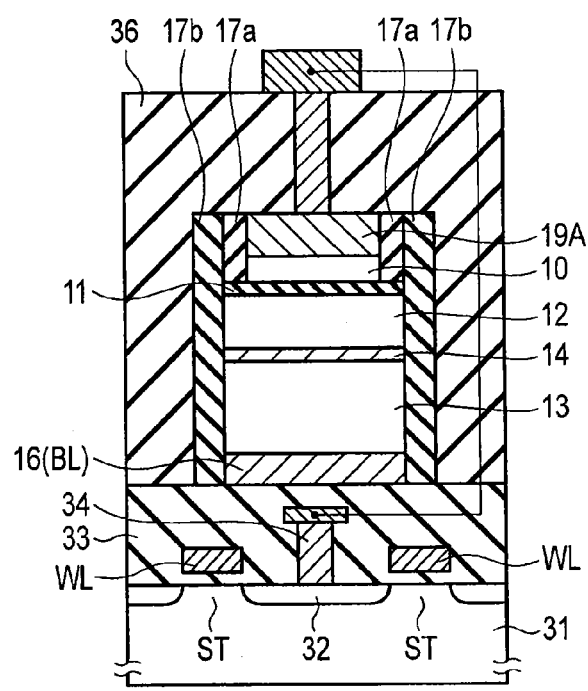

Next, as shown in FIG. 44, second protective layer (e.g., Si—N: 10 nm) 17*b* which covers magnetoresistive element MTJ is formed by using ALD. Moreover, interlayer insulating layer (e.g., $SiO_2$: 300 nm) 36 is formed on magnetoresistive element MTJ by use of a CVD method.

Then, a flattening treatment of an upper surface of interlayer insulating layer 36 is performed by using a CMP method.

Finally, an electrode to be connected to upper electrode 19A is formed on interlayer insulating layer 36. This electrode is electrically connected to selection transistor ST on semiconductor substrate 31.

By the above steps, the device structure according to the third embodiment is manufactured.

It is to be noted that in the illustrations of FIG. 37 to FIG. 44, a size of magnetoresistive element MTJ is larger than a size of contact plug 34, but the sizes are not limited to this drawing. For example, the size of magnetoresistive element MTJ may be equal to or smaller than the size of contact plug 34.

Moreover, the etching of FIG. 41 may be modified as follows.

FIG. 41 is on the assumption that the RIE is performed by using the $Cl_2$ gas, but in place of this assumption, upper electrode 19A and storage layer 10 can be patterned by ion beam etching by use of a rare gas. In this case, tunnel barrier layer 11 may be continuously be etched by this ion beam etching. At the same time, it is preferable that the etching is executed by using an end-hole type ion source with a large incidence solid angle and by generating a beam with 100 eV or less, so as to remove a re-deposition material on the sidewall of the magnetoresistive element MTJ in a low damage.

Moreover, after patterning upper electrode 19A and storage layer 10 by the RIE using the $Cl_2$ gas, tunnel barrier layer 11 may be etched by the RIE in which the $Cl_2$ gas is changed to the rare gas, i.e., usual physical etching.

Furthermore, after performing the patterning of upper electrode 19A and storage layer 10 by the RIE using the $Cl_2$ gas, a hydrogen gas is preferably introduced to form an electric discharge state in a gas atmosphere, thereby inserting a step of removing a halogen gas.

For example, when upper electrode 19A, storage layer 10, tunnel barrier layer 11 and reference layer 12 are patterned by ion beam etching (IBE) in FIG. 45, it is possible to obtain a structure in which side surfaces of upper electrode 19A, storage layer 10, tunnel barrier layer 11 and reference layer 12 are tapered as shown in FIG. 46.

Here, when upper electrode 19A and storage layer 10 are etched by the ion beam etching, tunnel barrier layer 11 is removed at the same time for the following reason.

When the ion beam etching (irradiation with ion beams) is performed, ions having high energy enter tunnel barrier layer 11, and generate crystal defects in tunnel barrier layer 11. When tunnel barrier layer 11 is, for example, MgO, there is generated a place where bond between Mg and O which are constitutional elements of tunnel barrier layer 11 partially weakens, and voids might be formed in tunnel barrier layer 11.

When tunnel barrier layer 11 in such a state is left as it is as shown in, for example, FIG. 47, in the portion of tunnel barrier layer 11 in which the bond between Mg and O weakens, oxygen (O) diffuses in reference layer 12, and bonds to a magnetic element in reference layer 12 by the subsequent heat treatment step. Therefore, magnetic anisotropic energy Ku of reference layer 12 decreases.

Conversely, when the magnetic elements in reference layer 12 diffuse in the voids generated in tunnel barrier layer 11 by this heat treatment step, a deviation is generated in a composition ratio of the magnetic elements constituting reference layer 12, thereby causing the similar phenomenon that magnetic anisotropic energy Ku of reference layer 12 decreases.

Shift corrective layer 13 of the present embodiment has a line shape, and hence a diamagnetic field in a direction in which the line extends is weak. Moreover, the magnetization of reference layer 12 easily turns to the same direction as the magnetization direction of shift corrective layer 13, depending on design of intermediate layer 14, by static magnetic combining of shift corrective layer 13 with intermediate layer 14.

Therefore, when the magnetic anisotropic energy of reference layer 12 deteriorates for a certain cause, as shown in FIG. 47, the magnetization of reference layer 12 easily fluctuates in the line direction, which causes spreading of a magnetic wall under storage layer 10.

This phenomenon does not easily occur, when storage layer 10 and reference layer 12 have about the same size, and when a shape of reference layer 12 is an in-plane rotation symmetric shape, for example, a disc shape, but the phenomenon easily occurs, when the shape of reference layer 12 is an in-plane rotation asymmetric shape, for example, the line shape, and when the magnetization direction of each of reference layer 12 and shift corrective layer 13 is an opposite direction.

As described above, when storage layer 10 is patterned by using the ion beam etching, tunnel barrier layer 11 is preferably removed at the same time. Especially, in magnetoresistive element MTJ comprising round storage layer 10 and linear reference layer 12 formed by the patterning by use of the rare gas, tunnel barrier layer 11 is removed at the patterning of storage layer 10, so that the effect of enhancement of yield can be obtained.

It is to be noted that around storage layer 10, tunnel barrier layer 11 may not completely be removed. As shown in, for example, FIG. 48, part of tunnel barrier layer 11 may be thin in an area close to the end of storage layer 10. Also in such a case, the effect of the enhancement of the yield can be obtained.

Moreover, when reference layer 12 is etched simultaneously with the patterning of storage layer 10, for example, point A of FIG. 46 becomes a discontinuous point of the thickness of reference layer 12. This discontinuous point also becomes a discontinuous point of magnetic wall energy, and serves as an energy barrier, when the magnetic wall comes under storage layer 10. Therefore, when the discontinuous point (point A) of the thickness of reference layer 12 is disposed below storage layer 10, reliability of magnetoresistive element MTJ enhances.

4. APPLICATION USE EXAMPLE

The magnetic memories according to the above-mentioned first to third embodiments can be applied to, for example, a spin injection magnetic random access memory (MRAM) using a spin transfer system.

Figure 49:
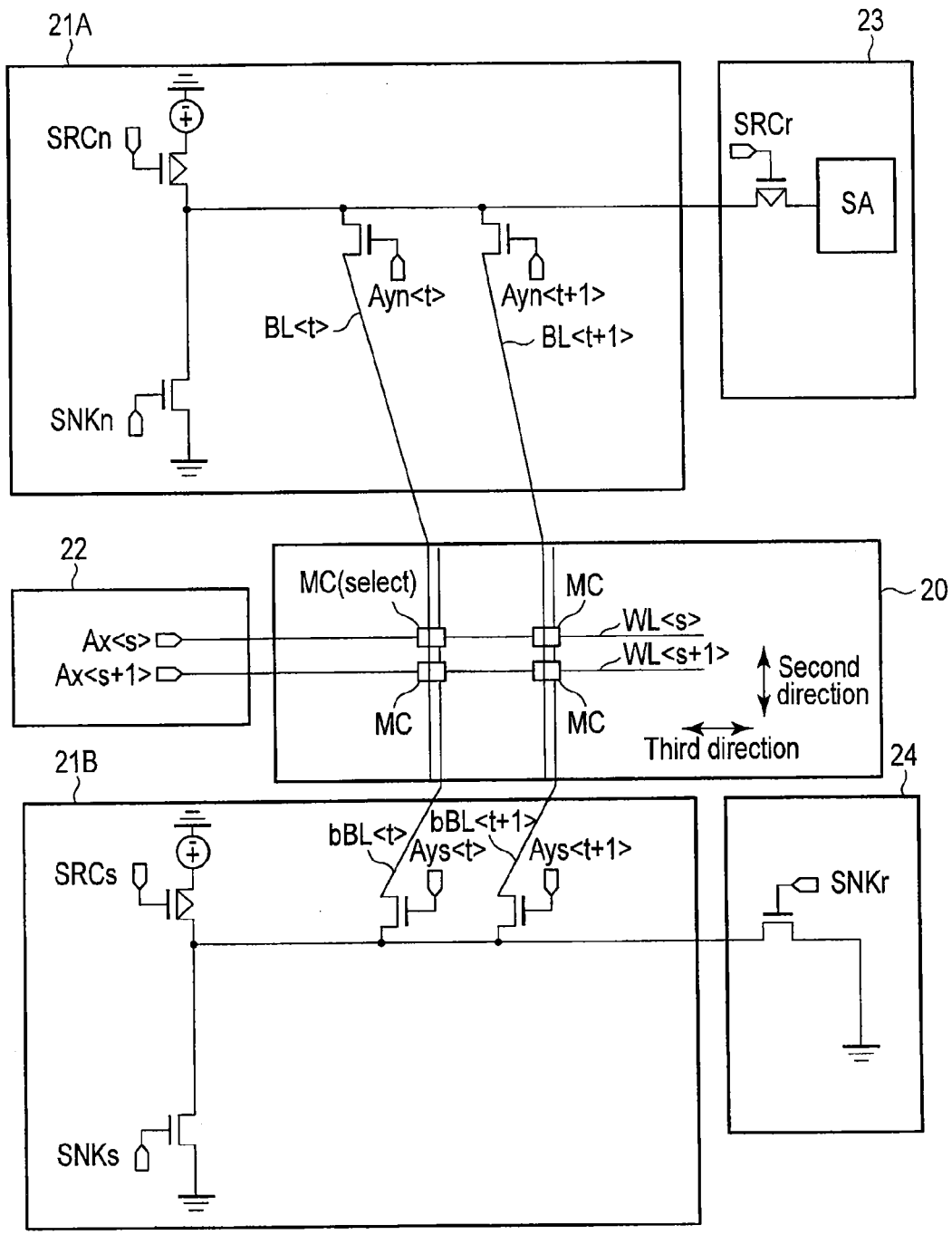
FIG. 49 is a view showing a magnetic random access memory.

FIG. 49 shows a circuit block diagram of the spin injection MRAM.

Memory cells MC in memory cell array 20 are connected to first bit lines (conductive layers) BL<t> and BL<t+1>, second bit lines (conductive layers) bBL<t> and bBL<t+1>, and word lines (conductive layers) WL<s> and WL<s+1>.

Magnetoresistive element MTJ in each of memory cells MC and first bit lines (conductive layers) BL<t> and BL<t+1> have the device structure according to the above-mentioned first to third embodiments.

First bit lines (conductive layers) BL<t> and BL<t+1> are connected to bit line driver/sinker 21A. Bit line driver/sinker 21A comprises switch elements (FET) subjected to on/off control by control signals Ayn<t> and Ayn<t+1>, and switch elements (FET) subjected to on/off control by control signals SRCn and SNKn.

Second bit lines (conductive layers) bBL<t> and bBL<t+1> are connected to bit line driver/sinker 21B. Bit line driver/sinker 21B comprises switch elements (FET) subjected to on/off control by control signals Ays<t> and Ays<t+1>, and switch elements (FET) subjected to on/off control by control signals SRCs and SNKs.

Word lines (conductive layers) WL<s> and WL<s+1> are connected to word line driver 22. Word line driver 22 drives word lines WL<s> and WL<s+1> by control signals Ax<s> and Ax<s+1>.

Reading circuits 23 and 24 comprise sense amplifiers SA and switch elements (FET) subjected to on/off control by control signals SRCr and SNKr.

In the present example, only four memory cells (2×2) MC are shown, but, for example, (s+1) memory cells may be arranged in the second direction, and (t+1) memory cells may be arranged in the third direction. Additionally, each of s and t is a natural number of 2 or more.

FIG. 50 shows a control circuit which generates control signals SRCn, SNKn, SRCs, SNKs, SRCr and SNKr of FIG. 49.

FIG. 51 shows a decoder which generates control signals Ayn<1:t+1>, Ays<1:t+1> and Ax<1:s+1> of FIG. 49.

Here, Ayn<1:t+1> means (t+1) control signals Ayn<1>, Ayn<2>, . . . Ayn<t+1>, and Ays<1:t+1> means (t+1) control signals Ays<1>, Ays<2>, . . . Ays<t+1>.

Similarly, Ax<1:s+1> means (s+1) control signals Ax<1>, Ax<2>, Ax<s+1>.

FIG. 52 shows an example of memory cell MC of FIG. 49.

Memory cell MC comprises magnetoresistive element MTJ and selection transistor ST which are connected in series. Magnetoresistive element MTJ is connected to, for example, first bit line BL<t>, and selection transistor ST is connected to, for example, second bit line bBL<t>.

A gate electrode of selection transistor ST is connected to, for example, word line WL<s>.

Figure 53:
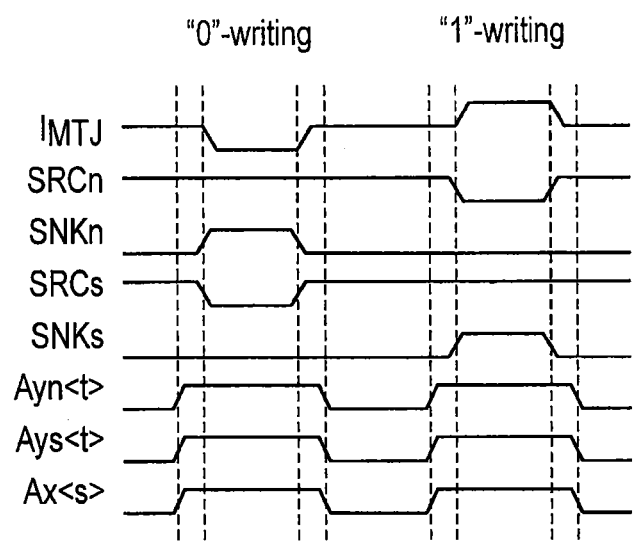
FIG. 53 is a diagram showing writing waveforms.

FIG. 53 shows a timing chart at writing.

First, for example, control signals Ayn<t>, Ays<t> and Ax<s> are set to "H(high)", thereby selecting upper left memory cell MC(select) of FIG. 49.

Then, for example, when "0"-writing (an anti-parallel state→a parallel state) is performed for memory cell MC(select), control signals SRCn and SNKn are set to "H", and control signals SRCs and SNKs are set to "L(low)", thereby allowing spin injection current (current pulse) $I_{MTJ}$ to flow from the storage layer toward the reference layer in magnetoresistive element MTJ.

Moreover, for example, when "1"-writing (the parallel state→the anti-parallel state) is performed for memory cell MC(select), control signals SRCn and SNKn are set to "L", and control signals SRCs and SNKs are set to "H", thereby allowing spin injection current (current pulse) $I_{MTJ}$ to flow from the reference layer toward the storage layer in magnetoresistive element MTJ.

In this way, when the spin injection current having the direction corresponding to writing data is allowed to flow through magnetoresistive element MTJ in memory cell MC(select), data writing is enabled.

Figure 54:
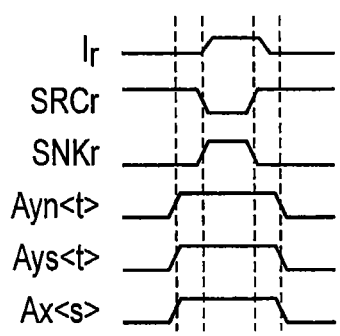
FIG. 54 is a diagram showing reading waveforms.

FIG. 54 shows a timing chart at reading.

First, for example, control signals Ayn<t>, Ays<t> and Ax<s> are set to "H", thereby selecting upper left memory cell MC(select) of FIG. 49.

Then, control signal SRCr is set to "L", and control signal SNKr is set to "H", thereby allowing, for example, reading current (current pulse) $I_r$ to flow from the reference layer toward the storage layer in magnetoresistive element MTJ.

Additionally, to prevent erroneous writing at reading, an absolute value of reading current $I_r$ needs to be sufficiently smaller than an absolute value of spin injection current $I_{MTJ}$ at the "0"/"1"-writing.

5. CONCLUSION

According to the embodiments, it is possible to realize the magnetic memory which can correct the shift of the RH curve of the storage layer, even when the saturated magnetization of the reference layer is not decreased in accordance with the fineness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
   a first magnetoresistive element comprising a storage layer with a perpendicular and variable magnetization, a tunnel barrier layer, and a reference layer with a perpendicular and invariable magnetization, and stacked in order thereof in a first direction; and
   a first shift corrective layer with a perpendicular and invariable magnetization, the first shift corrective layer and the storage layer arranged in a direction intersecting with the first direction, wherein
   magnetization directions of the reference layer and the first shift corrective layer are the same, and
   the first shift corrective layer projects to a side opposite to a side of the tunnel barrier layer more than a first surface of the storage layer opposite to a second surface of the storage layer on the side of the tunnel barrier layer.

2. The memory of claim 1, further comprising:
   a second magnetoresistive element comprising a storage layer with a perpendicular and variable magnetization, a tunnel barrier layer, and a reference layer with a perpendicular and invariable magnetization, and stacked in order of thereof in the first direction;

a second shift corrective layer with a perpendicular and invariable magnetization, the second shift corrective layer and the storage layer of the second magnetoresistive element arranged in the direction intersecting with the first direction, a first conductive layer extending in a second direction intersecting with the first direction, and connected to the first magnetoresistive element; and a second conductive layer extending in the second direction, and connected to the second magnetoresistive element, wherein magnetization directions of the reference layer of the second magnetoresistive element and the second shift corrective layer are the same, the first and second conductive layers are spaced apart a third direction intersecting with the first and second directions, and the first and second shift corrective layers are separated from each other.

3. The memory of claim 2, wherein a width of the first shift corrective layer in the third direction is equal to or larger than a width of the first magnetoresistive element in the third direction, and a width of the second shift corrective layer in the third direction is equal to or larger than a width of the second magnetoresistive element in the third direction.

4. The memory of claim 2, wherein the first conductive layer is connected to the reference layer of the first magnetoresistive element, and the first shift corrective layer, and the second conductive layer is connected to the reference layer of the second magnetoresistive element, and the second shift corrective layer.

5. The memory of claim 2, further comprising:

a third magnetoresistive element comprising a storage layer with a perpendicular and variable magnetization, a tunnel barrier layer, and a reference layer with a perpendicular and invariable magnetization, these layers being stacked in order thereof in the first direction, wherein the reference layers of the first and third magnetoresistive elements extend in the second direction in state of combining with each other, and are connected to the first conductive layer.

6. The memory of claim 1, wherein the storage layer is disposed above the reference layer.

7. The memory of claim 1, wherein the reference layer is disposed above the storage layer.

8. A magnetic memory comprising:

first and second magnetoresistive elements, each comprising a storage layer with a perpendicular and variable magnetization, a tunnel barrier layer, a reference layer with a perpendicular and invariable magnetization, and a shift corrective layer with a perpendicular and invariable magnetization, and provided in order thereof in a first direction, wherein magnetization directions of the reference layer and the shift corrective layer are opposite to each other, the first and second magnetoresistive elements are arranged in a second direction intersecting with the first direction, the reference layers of the first and second magnetoresistive elements extend in the second direction and are combined with each other, the shift corrective layers of the first and second magnetoresistive elements extend in the second direction and are combined with each other, a width of the storage layer in a third direction which intersects with the first and second directions is smaller than a width of the reference layer in the third direction, the tunnel barrier layers are arranged in a first area between the storage layer and the reference layer, and a second area other than the first area, and the tunnel barrier layer in the second area is thinner than the tunnel barrier layer in the first area.

9. The memory of claim 8, wherein a thickness of the tunnel barrier layer in the second area is thinner along a direction away from the storage layer.

10. A magnetic memory comprising:

first and second magnetoresistive elements, each comprising a storage layer with a perpendicular and variable magnetization, a tunnel barrier layer, a reference layer with a perpendicular and invariable magnetization, and a shift corrective layer with a perpendicular and invariable magnetization, and provided in order thereof in a first direction, wherein magnetization directions of the reference layer and the shift corrective layer are opposite to each other, the first and second magnetoresistive elements are arranged in a second direction intersecting with the first direction, the reference layers of the first and second magnetoresistive elements extend in the second direction and are combined with each other, the shift corrective layers of the first and second magnetoresistive elements extend in the second direction and are combined with each other, a width of the storage layer in a third direction which intersects with the first and second directions is smaller than a width of the reference layer in the third direction, and the tunnel barrier layer is disposed only in an area between the storage layer and the reference layer.

11. A magnetic memory comprising:

first and second magnetoresistive elements, each comprising a storage layer with a perpendicular and variable magnetization, a tunnel barrier layer, a reference layer with a perpendicular and invariable magnetization, and a shift corrective layer with a perpendicular and invariable magnetization, and provided in order thereof in a first direction, wherein magnetization directions of the reference layer and the shift corrective layer are opposite to each other, the first and second magnetoresistive elements are arranged in a second direction intersecting with the first direction, the reference layers of the first and second magnetoresistive elements extend in the second direction and are combined with each other, the shift corrective layers of the first and second magnetoresistive elements extend in the second direction and are combined with each other, a width of the storage layer in a third direction which intersects with the first and second directions is smaller than a width of the reference layer in the third direction, and the reference layer has an upper portion having a width in the third direction which is smaller than a width of the shift corrective layer in the third direction.

12. The memory of claim 11, wherein the upper portion of the reference layer has an inclined surface in the third direction.

13. The memory of claim 12, wherein the inclined surface has a change point of inclination which is a discontinuous point of a thickness of the reference layer.

14. The memory of claim 13, further comprising:
a semiconductor substrate;
a transistor on the semiconductor substrate;
an upper electrode on the first magnetoresistive element; and
a connection via-hole via which the transistor is connected to the upper electrode, wherein
the first magnetoresistive element is disposed above the transistor, and
the storage layer of the first magnetoresistive element is disposed above the reference layer of the first magnetoresistive element.

15. The memory of claim 11, wherein the storage layer of the first magnetoresistive element is disposed above the reference layer of the first magnetoresistive element.

16. The memory of claim 11, wherein the reference layer of the first magnetoresistive element is disposed above the storage layer of the first magnetoresistive element.

17. The memory of claim 11, further comprising:
a transistor, wherein
one end of the first magnetoresistive element is connected to the transistor.

18. A magnetic memory comprising:
first and second magnetoresistive elements, each comprising a storage layer with a perpendicular and variable magnetization, a tunnel barrier layer, a reference layer with a perpendicular and invariable magnetization, and a shift corrective layer with a perpendicular and invariable magnetization, and provided in order thereof in a first direction; and
a conductive layer which extends in a second direction intersecting with the first direction, wherein
magnetization directions of the reference layer and the shift corrective layer are opposite to each other,
the first and second magnetoresistive elements are arranged in the second direction intersecting with the first direction,
the reference layers of the first and second magnetoresistive elements extend in the second direction and are combined with each other,
the shift corrective layers of the first and second magnetoresistive elements extend in the second direction and are combined with each other, and
the conductive layer is connected in common to the shift corrective layers of the first and second magnetoresistive elements.

19. The memory of claim 18, wherein a width of the reference layer in the third direction is smaller than a width of the shift corrective layer in the third direction.

* * * * *